(12) United States Patent
Matsumura

(10) Patent No.: US 10,319,436 B2
(45) Date of Patent: Jun. 11, 2019

(54) SYSTEM INCLUDING PROGRAMMABLE INTEGRATED CIRCUIT INCLUDING FIRST AREAS HAVING SAME SHAPE AND SECOND AREAS FORMED BETWEEN FIRST AREAS, AND OPERATION PROCESSING DEVICE AND METHOD FOR CONTROLLING THE PROGRAMMABLE INTEGRATED CIRCUIT

(71) Applicant: FUJITSU LIMITED, Kawasaki-shi, Kanagawa (JP)

(72) Inventor: Hidetoshi Matsumura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 141 days.

(21) Appl. No.: 15/289,410

(22) Filed: Oct. 10, 2016

(65) Prior Publication Data

US 2017/0169882 A1    Jun. 15, 2017

(30) Foreign Application Priority Data

Dec. 11, 2015 (JP) ................................ 2015-241788

(51) Int. Cl.
| | |
|---|---|
| G11C 11/56 | (2006.01) |
| G06F 15/78 | (2006.01) |
| G06F 9/22 | (2006.01) |
| G06F 17/50 | (2006.01) |
| G06F 15/80 | (2006.01) |

(52) U.S. Cl.
CPC .......... *G11C 11/5628* (2013.01); *G06F 9/223* (2013.01); *G06F 15/7867* (2013.01); *G06F 15/8007* (2013.01); *G06F 17/5027* (2013.01)

(58) Field of Classification Search
CPC ........................ G11C 11/5628; G06F 15/8007
See application file for complete search history.

(56) References Cited

U.S. PATENT DOCUMENTS

| 5,631,578 A | 5/1997 | Clinton et al. |
|---|---|---|
| 2006/0195684 A1 | 8/2006 | Fukatsu |

FOREIGN PATENT DOCUMENTS

| JP | 09-026870 | 1/1997 |
|---|---|---|
| JP | 2006-236106 | 9/2006 |

*Primary Examiner* — Reginald G Bragdon
*Assistant Examiner* — Edward Wang
(74) *Attorney, Agent, or Firm* — Fujitsu Patent Center

(57) ABSTRACT

A device is configured to control a programmable integrated circuit having a plurality of first areas each of which has the same shape and a plurality of second areas formed between the plurality of first areas. The device includes: a memory; and a processor configured to: recognize an operation request executed by the programmable integrated circuit, select a third area and a fourth area used for configuring an operational circuit, by which processing pertaining to the operation request, from the plurality of first areas and the plurality of second areas, cause the selected third area and the selected fourth area to function as an operation processing unit to generate the operational circuit, cause the generated operational circuit to execute processing pertaining to the operation request, and after the processing is completed, cause the third area included in the operational circuit to function as a communication path.

15 Claims, 24 Drawing Sheets

FIG. 3

```
// POINTER TO CONFIGURATION INFORMATION
typedef (POINTER TO CONFIGURATION INFORMATION) config_ptr_t;

// POINTER ARRAY TO COMMUNICATION NETWORK INFORMATION
config_ptr_t noc_config_data[3] = {ENUMERATE POINTERS TO CONFIGURATION INFORMATION
        CORRESPONDING TO EACH OF area_type_router, area_type_path_hori, area_type_path_vert};

// INFORMATION FOR EACH OPERATION TYPE
struct calc_type_info_t{
    int     calc_sizex;      // NUMBER OF AREAS USED FOR OPERATION (x-DIRECTION)
    int     calc_sizey;      // NUMBER OF AREAS USED FOR OPERATION (y-DIRECTION)

// TWO DIMENSIONAL ARRAY OF POINTERS TO CONFIGURATION INFORMATION CONFIGURING
    // OPERATIONAL CIRCUIT, SIZE IS calc_sizex/y OF ↑
    config_ptr_t config_data[calc_sizex][calc_sizey];
};

// index OF OPERATION ARRAY BECOMES calc_type_id
calc_type_info_t calc_type_info[NUMBER OF OPERATION TYPES];
```

FIG. 5

```
enum area_type_t{
  area_type_router    = 0,    // REPRESENT router
  area_type_path_hori = 1,    // REPRESENT HORIZONTAL WIRE AREA
  area_type_path_vert = 2,    // REPRESENT VERTICAL WIRE AREA
  area_type_calc      = 3     // REPRESENT OPERATION AREA
};

struct area_info_t{
  area_type_t  area_type;     // AREA TYPE (NOT CHANGED AFTER INITIALIZATION)
  bool         used;          // FLAG INDICATING WHETHER AREA IS USED AS OPERATIONAL CIRCUIT
  int          calc_type_id;  // ID IDENTIFYING TYPE OF CERTAIN OPERATION ON AREA
  int          calc_posx;     // INDICATE WHICH AREA IN OPERATION IS USED
  int          calc_posy;     // INDICATE WHICH AREA IN OPERATION IS USED
};

area_info_t area_info[FPGA_SIZE_X][FPGA_SIZE_Y];
```

FIG. 6

```
struct calc_instance_info_t{
    int     calc_type_id;    // ID WHICH IS UNIQUE FOR EACH OPERATION TYPE
    int     posx;            // x-COORDINATE OF AREA IN WHICH UPPER LEFT AREA OF OPERATION
                             //   INSTANCE IS ARRANGED
    int     posy;            // y-COORDINATE OF AREA IN WHICH UPPER LEFT AREA OF OPERATION
                             //   INSTANCE IS ARRANGED
};

executing_calc_instance_info_list IS LIST MANAGING INDEFINITE NUMBER OF INSTANCES OF
"calc_instance_info_t.
IMAGES SUCH AS list, vector, OR THE LIKE OF C++ STL
```

```
// area_info INITIALIZATION
for(int y=0;y<FPGA_SIZE_Y;y++){
  for(int x=0;x<FPGA_SIZE_X;x++){
    if     (x%2==0 && y%2==0)area_info[x][y].area_type = area_type_router;
    else if(x%2==1 && y%2==0) area_info[x][y].area_type = area_type_path_hori;  ⎫
    else if(x%2==0 && y%2==1) area_info[x][y].area_type = area_type_path_vert;  ⎬ P1
    else                                                                         ⎪
            area_info[x][y].area_type = area_type_calc;                          ⎭
    area_info[x][y].used = false;  ← P3 if     (x%2==0 && y%2==0) WRITING OF noc_config_info[0] INTO CORRESPONDING AREA;  ⎫
    else if(x%2==1 && y%2==0) WRITING OF noc_config_info[1] INTO CORRESPONDING AREA;  ⎬ P2
    else if(x%2==0 && y%2==1) WRITING OF noc_config_info[2] INTO CORRESPONDING AREA;  ⎭
  }
}

// executing_calc_instance_info_list INITIALIZATION
MAKE "executing_calc_instance_info_list" INTO STATE HAVING NO ELEMENT  ← P4
```

SYSTEM INCLUDING PROGRAMMABLE INTEGRATED CIRCUIT INCLUDING FIRST AREAS HAVING SAME SHAPE AND SECOND AREAS FORMED BETWEEN FIRST AREAS, AND OPERATION PROCESSING DEVICE AND METHOD FOR CONTROLLING THE PROGRAMMABLE INTEGRATED CIRCUIT

CROSS-REFERENCE TO RELATED APPLICATION

This application is based upon and claims the benefit of priority of the prior Japanese Patent Application No. 2015-241788, filed on Dec. 11, 2015, the entire contents of which are incorporated herein by reference.

FIELD

The embodiments discussed herein are related to an operation processing device, a system, and a method.

BACKGROUND

In recent years, an operation processing system is implemented by mixing a central processing unit (CPU) and a field programmable gate array (FPGA) as processors in a data center in order to attain speeding up of data processing or reduction of power consumption. The FPGA is a programmable integrated circuit (large scale integration (LSI)) and is used as hardware of which algorithm is capable of being corrected and expanded in the operation processing system described above.

As examples of the prior art, for example, Japanese Laid-open Patent Publication No. 9-26870 and Japanese Laid-open Patent Publication No. 2006-236106 are known.

SUMMARY

According to an aspect of the invention, an operation processing device configured to control a programmable integrated circuit capable of arbitrarily changing an internal circuit configuration, the programmable integrated circuit having a plurality of first areas each of which has the same shape and a plurality of second areas formed between the plurality of first areas, the operation processing device includes: a memory; and a processor coupled to the memory and configured to: recognize an operation request executed by the programmable integrated circuit, select a third area and a fourth area used for configuring an operational circuit, by which processing pertaining to the operation request, from the plurality of first areas and the plurality of second areas, cause the selected third area and the selected fourth area to function as an operation processing unit to generate the operational circuit, cause the generated operational circuit to execute processing pertaining to the operation request, and after the processing is completed, cause the third area included in the operational circuit to function as a communication path.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 illustrates a data structure of operational information used for the operation processing device as the example of the first embodiment;

FIG. 5 illustrates a data structure of FPGA management information used for the operation processing device as the example of the first embodiment;

FIG. 6 illustrates a data structure of active execution processing information used for the operation processing device as the example of the first embodiment;

FIG. 7 illustrates an FPGA initialization scheme in the operation processing device as the example of the first embodiment;

DESCRIPTION OF EMBODIMENTS

In an operation processing system of the related art, an FPGA is used in an execution of a single type of task and accordingly, is not efficiently utilized. In one aspect, the present embodiment intends to improve processing performance of an operation processing device.

Hereinafter, description will be made on embodiments of an operation processing device, an operation processing system, and an operation processing method of the present disclosure with reference to the accompanying drawings. However, the embodiments described in the following are for illustrative purpose only and it is not intended to exclude application of various modification examples or techniques which are not clarified in the embodiments. That is, the present embodiment can be embodied by being variously modified in a range without departing from the gist of the embodiment (a combination of the embodiment and respective modification examples, or the like). The drawings are not intended to include only constitutional elements illustrated, but may include others function or the like.

(A) First Embodiment (A-1) Hardware Configuration

Figure 1:
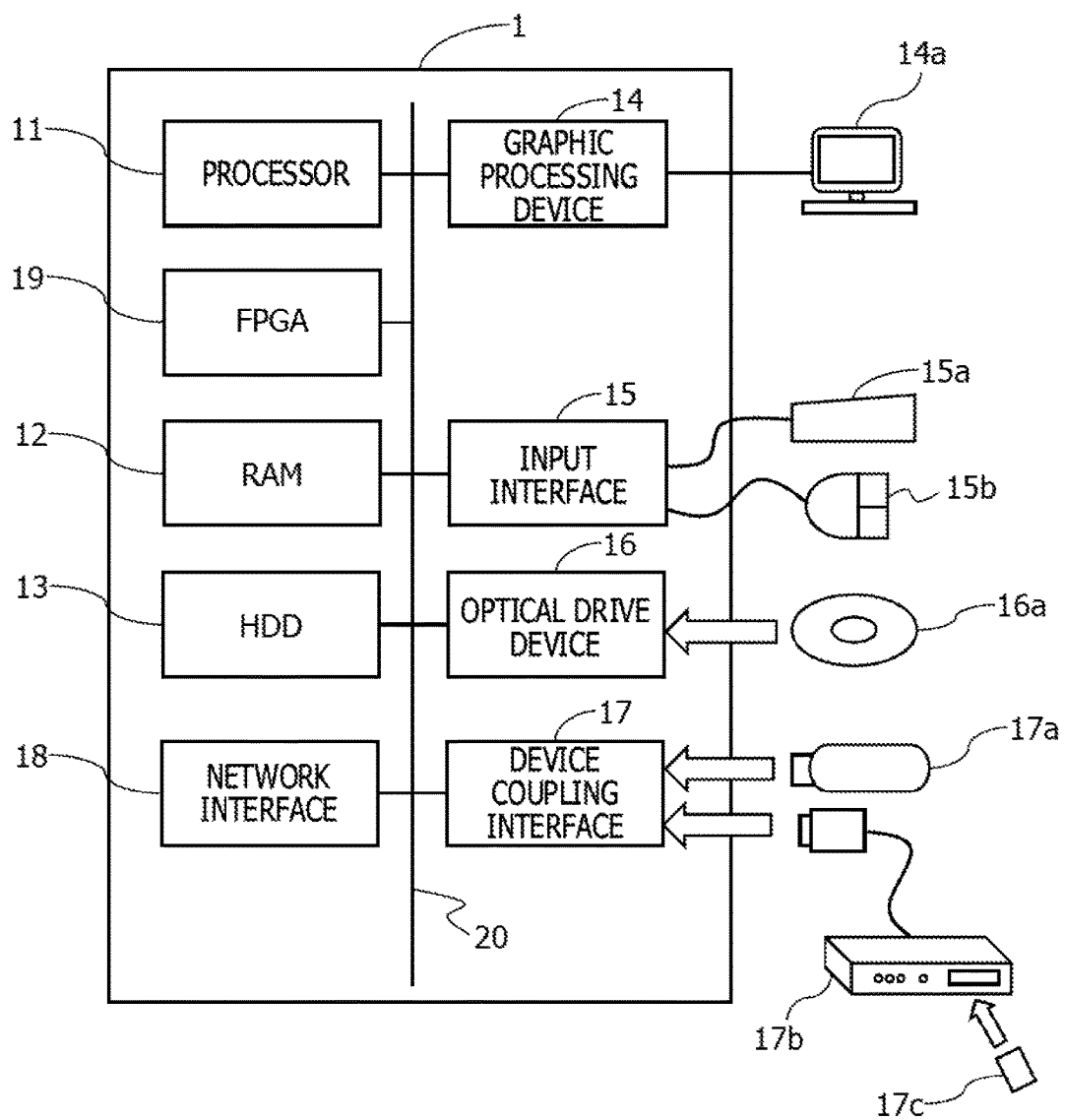
FIG. 1 illustrates a hardware configuration of an operation processing device as an example of a first embodiment.

FIG. 1 illustrates a hardware configuration of an operation processing device 1 as an example of a first embodiment. An operation processing device 1 is, for example, a computer (information processing device) equipped with a server function, is equipped with a processor 11 and an FPGA 19 as illustrated in FIG. 1, and executes information processing such as an operation or the like using the processing device (processing unit).

Description will be made on a hardware configuration of the operation processing device 1 of the first embodiment with reference to FIG. 1. The operation processing device 1 includes, for example, a processor 11, a random access memory (RAM) 12, a hard disk drive (HDD) 13, a graphic processing device 14, an input interface 15, an optical drive device 16, a device coupling interface 17, a network interface 18, and an FPGA 19 as constitutional elements. These constitutional elements 11 to 19 are configured to be communicated with each other through a bus 20.

The processor 11 controls the operation processing device 1 in its entirety. The processor 11 may also be a multiprocessor. The processor 11 may also be, for example, any of a central processing unit (CPU), a micro processing unit (MPU), a digital signal processor (DSP), an application specific integrated circuit (ASIC), and a programmable logic device (PLD). The processor 11 may be a combination of two or more of the CPU, the MPU, the DSP, the ASIC, and the PLD. In the following, an example in which the processor 11 is a CPU is described and the processor 11 is represented as a CPU 11.

A RAM (storage unit) 12 is used as a main storage device of the operation processing device 1. In the RAM 12, at least a portion of an operating system (OS) program for execution by the processor 11 or an application program is temporarily stored. In the RAM 12, various pieces of data desired for processing by the processor 11 are stored. The application program may also include an operation processing program executed by the CPU 11 in order to implement operation processing functions of the first embodiment by the operation processing device 1 which is a computer.

In the RAM 12, a piece of configuration information (partial configuration information) used for forming the operational circuit onto the FPGA 19 read out from the HDD 13 or the like is stored as will be described later. The HDD (storage unit) 13 magnetically writes data into and reads out data from a disk having built therein. The HDD 13 is used as an auxiliary storage device of the operation processing device 1. In the HDD 13, the OS program, the application program, and various data are stored. A semiconductor storage device such as a flash memory may also be used as an auxiliary storage device. A solid state drive (SSD) is an example of the semiconductor storage device.

The graphic processing device 14 is coupled to a monitor 14a. The graphic processing device 14 displays an image on a screen of the monitor 14a according to instruction from the processor 11. The monitor 14a may include a display device using a cathode ray tube (CRT), a liquid crystal display device (LCD), or the like. The input interface 15 is coupled to a keyboard 15a and a mouse 15b. The input interface 15 transmits signal sent out from the keyboard 15a or the mouse 15b to the CPU 11. The mouse 15b is an example of a pointing device and other pointing devices may also be used. Other pointing devices may include a touch panel, a tablet, a touch pad, a track ball, or the like.

The optical drive device 16 reads data recorded in an optical disk 16a using laser light. The optical disk 16a is a portable non-transitory recording medium from which data capable of being read by reflection of light. The optical disk 16a may include a digital versatile disc (DVD), a DVD-RAM, a compact disc read only memory (CD-ROM), a CD-R (Recordable)/RW (Rewritable), or the like.

The device coupling interface 17 is a communication interface for coupling peripheral devices to the operation processing device 1. For example, the device coupling interface 17 is able to be coupled to a memory device 17a or a memory reader/writer 17b. The memory device 17a is a non-transitory recording medium installed with a function of communicating with the device coupling interface 17 and is, for example, a Universal Serial Bus (USB) memory. The memory reader/writer 17b performs a data write into a memory card 17c and a data read from the memory card 17c. The memory card 17c is a card-type non-transitory recording medium.

The network interface 18 is coupled to a network (not illustrated). The network interface 18 performs data transmission and reception with other computers or communication devices through a network. The FPGA 19 is a programmable LSI (programmable integrated circuit). The FPGA 19 has an architecture in which an operational circuit is couple with the outside of the FPGA by network on chip (NoC). The operational circuit and the NoC are built together on a programmable logic circuit, and the architecture of the FPGA 19 is not provided with NoC which is made unalterable at the time of manufacture.

Figure 2:
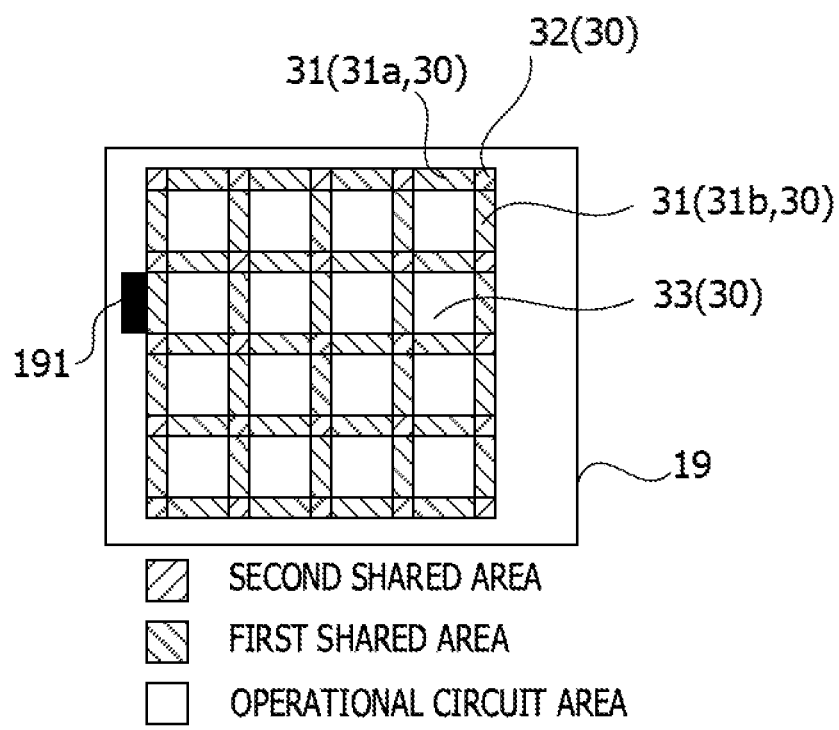
FIG. 2 is a diagram illustrating an FPGA provided in the operation processing device as the example of the first embodiment.

FIG. 2 is a diagram illustrating the FPGA 19 provided in the operation processing device 1 as the example of the first embodiment. The FPGA 19, as illustrated in FIG. 2, includes a plurality of first shared areas 31, second shared areas 32, and operational circuit areas 33. Each operational circuit area 33 is used as an area which allows an operation process to be executed by an operational circuit. The plurality of operational circuit areas 33 included in the FPGA 19 has the same rectangular shape with each other. In the first embodiment, respective operational circuit areas 33 have a square shape.

These operational circuit areas 33, as illustrated in FIG. 2, are arranged at equal intervals in each direction of the up and down direction and left and right direction in the FPGA 19. That is, the plurality of operational circuit areas 33 are arranged in a matrix form in the FPGA 19. That is, the operational circuit areas 33 are disposed in a grid unit arrangement in the FPGA 19. A piece of configuration information (operational circuit configuration information), which configures an operational circuit, is set to each operational circuit area 33 by the CPU 11, which will be describe later, and thus each operational circuit area 33 functions as the operational circuit.

Respective operational circuit areas 33 are areas formed by dividing the FPGA 19 and correspond to a plurality of first areas (operational circuit arrangement area) which have the same shape and in which an internal circuit is capable of being reconfigured. In the following, the configuration information (operational circuit configuration information) for causing the respective operational circuit areas 33 to function as the operational circuit may be referred to as first partial configuration information. In the FPGA 19, gaps between adjacent operational circuit areas 33 constitute the first shared areas 31. That is, the first shared areas 31 are arranged in a lattice pattern which partitions the operational circuit areas 33 at equal intervals in the longitudinal direction and the transverse direction in the FPGA 19.

Furthermore, second shared areas 32 are arranged at respective intersection portions of the first shared areas 31 arranged in a lattice pattern. Respective first shared areas 31 function as wire areas (coupling circuits) when subjected to setting of the configuration information (wiring circuit configuration information) which configures a wiring circuit by the CPU 11. In the following, the first shared areas 31 which function as wire areas when subjected to setting of the configuration information which configures the wiring circuit by the CPU may be referred to as the wire 31.

The wire 31 couples the operational circuit areas 33 and other elements to be accessible and, for example, couples the CPU 11 or the RAM 12 or the like to the operational circuit areas 33. A target to be coupled to the operational circuit areas 33 by the wire 31 is not limited to the CPU 11 or the RAM 12. For example, in a case where a port provided with the FPGA 19 is installed on a general purpose server, various elements such as an Ethernet (registered trademark) module or the like are coupled to the operational circuit areas 33 in a wide range of, in addition to the RAM 12 installed on the port. In the following, description will be made on an example in which respective operational circuit areas 33 are coupled to the CPU 11 by the wire 31.

In the following, a wiring formed along a longitudinal direction of the wire 31 may be referred to as a longitudinal wire 31b and a wiring formed along a transverse direction may be referred to as a transverse wire 31a. Respective second shared areas 32 function as a router when subjected to setting of the configuration information (router circuit configuration information) which configures the router circuit by the CPU 11. In the following, the respective second shared areas 32 which function as a router when subjected to setting of configuration information which configures a router circuit may be referred to as a router 32.

The router 32 couples the operational circuit areas 33 and the CPU 11 to be accessible. In the first embodiment, the respective operational circuit area 33 are coupled to the wire 31 through the router 32 positioned in the top left corner of the respective operational circuit areas 33. In the FPGA 19, an operational circuit formed by using one or more operational circuit areas 33 or the like is coupled to an external interface (I/F) 191 through a coupling circuit (communication network) formed by connecting the wire 31 and the router 32 and is coupled to the CPU 11 through a bus 20.

The external I/F 191 is an interface circuit for performing communication with the outside in the FPGA 19 and the operational circuit formed in the FPGA 19 communicates with the outside of the FPGA 19 (for example, CPU 11) through the external I/F 191. The respective first shared areas 31 and respective second shared areas 32 function as the coupling circuit (communication network) coupling the respective operational circuit areas 33 and the CPU 11. In the following, configuration information which causes the respective first shared areas 31 and the respective second shared areas 32 as a coupling circuit may be referred to as coupling circuit configuration information.

Furthermore, the respective first shared areas 31 and the respective second shared areas 32 also function as the operational circuit, similar to the operational circuit areas 33 when subjected to setting of the configuration information (operational circuit configuration information) which configures the operational circuit by the CPU 11. That is, the FPGA 19 has a non-fixed NoC configuration. Accordingly, the respective first shared areas 31 and the respective second shared areas 32 function as the coupling circuit as well as the operational circuit, respectively. In the following, configuration information (operational circuit configuration information) for causing the respective first shared areas 31 and respective the second shared areas 32 to function as the operational circuit may be referred to as second partial configuration information.

The respective first shared areas 31 and the respective second shared areas 32 are areas formed by dividing the FPGA 19 and correspond to a plurality of second areas (coupling circuit arrangement area) which have the same shape and in which an internal circuit is capable of being reconfigured. In the following, the first shared areas 31, the second shared areas 32 and the operational circuit areas 33 may be collectively referred to as a partial area 30.

In the following, a set of a plurality of partial areas 30 (first shared area 31, second shared area 32, and operational circuit area 33) constituting a single operational circuit may be referred to as an operational circuit resource group. In the following, for example, an alphabet (A, B, . . . ) is used as an identifier of an operation type and for example, an operational circuit implementing an operation type A is represented as an operational circuit A. A plurality of partial areas 30 constituting the operational circuit A may be referred to as an operational circuit resource group A.

The operation processing function of the first embodiment may be implemented by the operation processing device (computer) 1 having the hardware configuration described above. The operation processing device 1 may execute, for example, a program (operation processing program or the like) recorded in a computer readable non-transitory recording medium to implement the operation processing function of the first embodiment. The program describing processing contents to be executed by the operation processing device 1 may also be recorded in various recording media. For example, a program for execution by the operation processing device 1 may be stored in the HDD 13. The CPU 11 loads at least a portion of the program stored in the HDD 13 onto the RAM 12 and executes the loaded program.

The program for execution by the operation processing device 1 (CPU 11) may be recorded in a non-transitory portable recording medium such as an optical disk 16a, a memory device 17a, and a memory card 17c. The program stored in a portable recording medium becomes executable after being installed into the HDD 13, for example, by control of the processor 11. The processor 11 may directly read out the program from the portable recording medium to execute the program.

(A-2) Various Pieces of Information or the Like

Next, description will be made on various pieces of information or the like using in the operation processing device 1. In the following, an example in which a data structure or commands or the like is described using a format in compliance with the C language. However, description of the data structure or commands or the like is not limited thereto but may be either represented in a format in compliance with a programming language other than the C language or embodied by being variously modified.

FIG. 3 illustrates a data structure of operational information used in the operation processing device 1 as the example of the first embodiment. FIG. 3 illustrates a data structure of the information relating to an operation executable by the FPGA 19 and the partial configuration information of the FPGA 19. For example, a "config_ptr_t" is a pointer to indicate a storage location of each piece of configuration information (partial configuration information) stored in the RAM 12.

An "area_type_router" is a piece of configuration information for implementing the router 32. An "area_type_path_hori" is a piece of configuration information for implementing the transverse wire 31a and an "area_type_path_vert" is a piece of configuration information for implementing the longitudinal wire 31b. In the following, each of the pieces of configuration information for implementing the router 32 and the longitudinal wire 31b, and the transverse wire 31a may be referred to as communication network configuration information.

A "noc_config_data[3]" is a piece of configuration information for implementing the coupling circuit and is a pointer array configured by enumerating pointers to the pieces of configuration information that correspond to each of the router 32, the transverse wire 31a, and the longitudinal wire 31b. As such, in the operation processing device 1, circuit configuration information of the FPGA 19 is configured by being divided into a plurality of modules (partial configuration information) that constitute each of the transverse wire 31a, the longitudinal wire 31b, and the router 32. These pieces of partial configuration information are individually set to respective partial areas 30 so as to be subjected to circuit setting partially (for each partial area 30).

A "calc_type_info_t" is a piece of information (operational information 122) regarding an operation and indicates the number of partial areas 30 used for implementing the operation in the FPGA 19. A "calc_type_info_t" is provided with a "calc_sizex" and a "calc_sizey". The "calc_sizex" indicates the number of transverse directions (X-direction) (number of columns) of the partial area 30 used for the operation, and the "calc_sizey" indicates the number of longitudinal directions (Y-direction) (number of rows) of the partial area 30 used for the operation.

A "config_data[calc_sizex][calc_sizey]" is a two dimensional array of pointers to pieces of configuration information configuring the operational circuit and is represented using the "calc_sizex/y". For example, in the example illustrated in the reference symbol (2) of FIG. 4, which will be described later, an operational circuit of an operation type B is a "config_data[1][3]" and the "config_data[1][3]" indicates that the operational circuit is formed by using the partial area 30, which has one column in the transverse direction and three rows in the longitudinal direction, in the FPGA 19.

An index of the operation array becomes a "calc_type_id". A "calc_type_info[number of operation types]" indicates the number of operation types and the number of operation types is two (operation types A and B) in the first embodiment.

Figure 4:
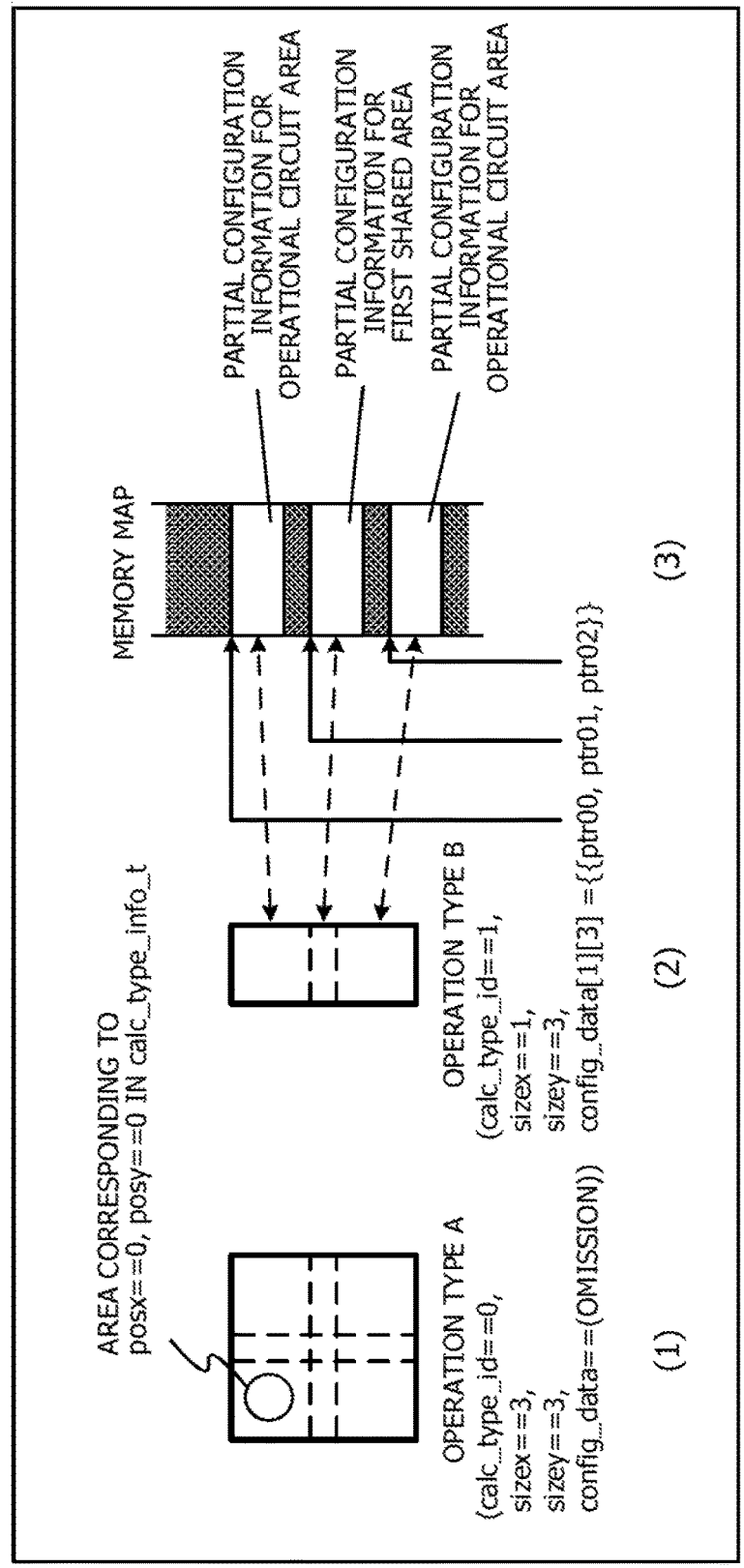
FIG. 4 is a diagram illustrating an operational circuit formed in the FPGA in the operation processing device as the example of the first embodiment.

FIG. 4 is a diagram illustrating an operational circuit formed in the FPGA 19 in the operation processing device 1 as the example of the first embodiment. In FIG. 4, the reference symbol (1) schematically illustrates an operational circuit for processing an operation request for an operation type A. The reference symbol (2) schematically illustrates an operational circuit for processing an operation request for an operation type B. In the following, the operational circuit for processing the operation request for the operation type A is referred to as an the operational circuit A and the operational circuit for processing the operation request for the operation type B is referred to as an the operational circuit B.

An operational circuit which is arranged in the FPGA 19 and in an executable state may be referred to as an operation instance or simply an instance. In the following, forming of the operational circuit onto the FPGA 19 may be referred to as loading of the operational circuit. In FIG. 4, the reference symbol (3) is a memory map indicating a state where a piece of configuration information (partial configuration information) for implementing the operational circuit is B stored in the RAM 12.

In a predetermined area of the RAM 12, a piece of configuration information for forming the operational circuit is stored and a plurality of types configuration information according to a type of the operation process implemented by the FPGA 19 are stored. As described above, the first shared areas 31, the second shared areas 32, and the operational circuit areas 33 are included in the operational circuit formed in the FPGA 19. Accordingly, in the RAM 12, separate pieces of configuration information (partial configuration information) for setting respective areas of the first shared area 31, the second shared area 32, and the operational circuit area 33 are stored, respectively.

In the memory map of the RAM 12 indicated in the reference symbol (3) of FIG. 4, three pieces of partial configuration information that correspond to three partial areas 30 (see reference symbol (2) of FIG. 4) for constituting the operational circuit of the operation type B are stored and respective storage locations are indicated by pointers (ptr00, ptr01, and ptr02). These pointers are stored in the "config_data[1][3]" and thus, the example in which these pointers are associated with the operation type B, as the piece of partial configuration information configuring the operational circuit of the operation type B.

FIG. 5 illustrates a data structure of FPGA management information 121 used for the operation processing device 1 as the example of the first embodiment. The FPGA management information 121 is a piece of information indicates how respective partial areas 30 on the FPGA 19 are used and an example in which the FPGA management information 121 is described as an "area_info" is indicated in FIG. 5.

In the example illustrated in FIG. 5, an "area_type_router" represents the router 32 and is selected by "0". An "area_type_path_hori" represents a horizontal wire area (transverse wire 31a) and is selected by "1". An "area_type_path_vert" represents a vertical wire area (longitudinal wire 31b) and is selected by "2". An "area_type_calc" represents an operation area (operational circuit area 33) and is selected by "3".

An "area_info_t" is a piece of information about a single partial area and is provided with an "area_type", a "used", a "calc_type_id", a "calc_posx", and "calc_posy". The "area_type" indicates an area type. A value of the "area_type" is not changed after initialization. The "used" is a flag indicates whether an area is used as the operational circuit or not. The "calc_type_id" indicates identification (ID) which identifies an operation type of a certain operation which exists on an area. In the example illustrated in FIG. 4, the ID of the operation having the operation type A is "0" and the ID of the operation having the operation type B is "1".

The "calc_posx" and the "calc_posy" indicates which area in the operation circuit is used. The "calc_posx" and the "calc_posy" indicate a position in the X-direction and a position in the Y-direction, respectively. An "area_info[FPGA_SIZE_X][FPGA_SIZE_Y]" manages how all partial areas of the FPGA 19 are used. The "FPGA_SIZE_X" and the "FPGA_SIZE_Y" represent sizes of the FPGA in the transverse direction and the longitudinal direction by the number of partial areas, respectively.

FIG. 6 illustrates a data structure of active execution processing information 123 used for the operation processing device 1 as the example of the first embodiment. Active execution processing information 123 is a piece of information about the operational circuit (operation instance) on the FPGA 19. In FIG. 6, an example, in which a data structure of the operational information corresponding to a single operational circuit (operation instance) is described as a "calc_instance_info_t", is indicated.

In the example illustrated in FIG. 6, the "calc_instance_info_t" is provided with a "calc_type_id", a "posx", and a "posy". The "calc_type_id" is the identification information (ID) of the operation type and is set as a value which is unique for each operation type. The "posx" indicates the X-coordinate of the partial area 30 in which a reference position (upper left area in the first embodiment) of an operation instance. The "posy" indicates the Y-coordinate of the partial area 30 in which a reference position (upper left area in the first embodiment) of the operation instance.

Figure 8:
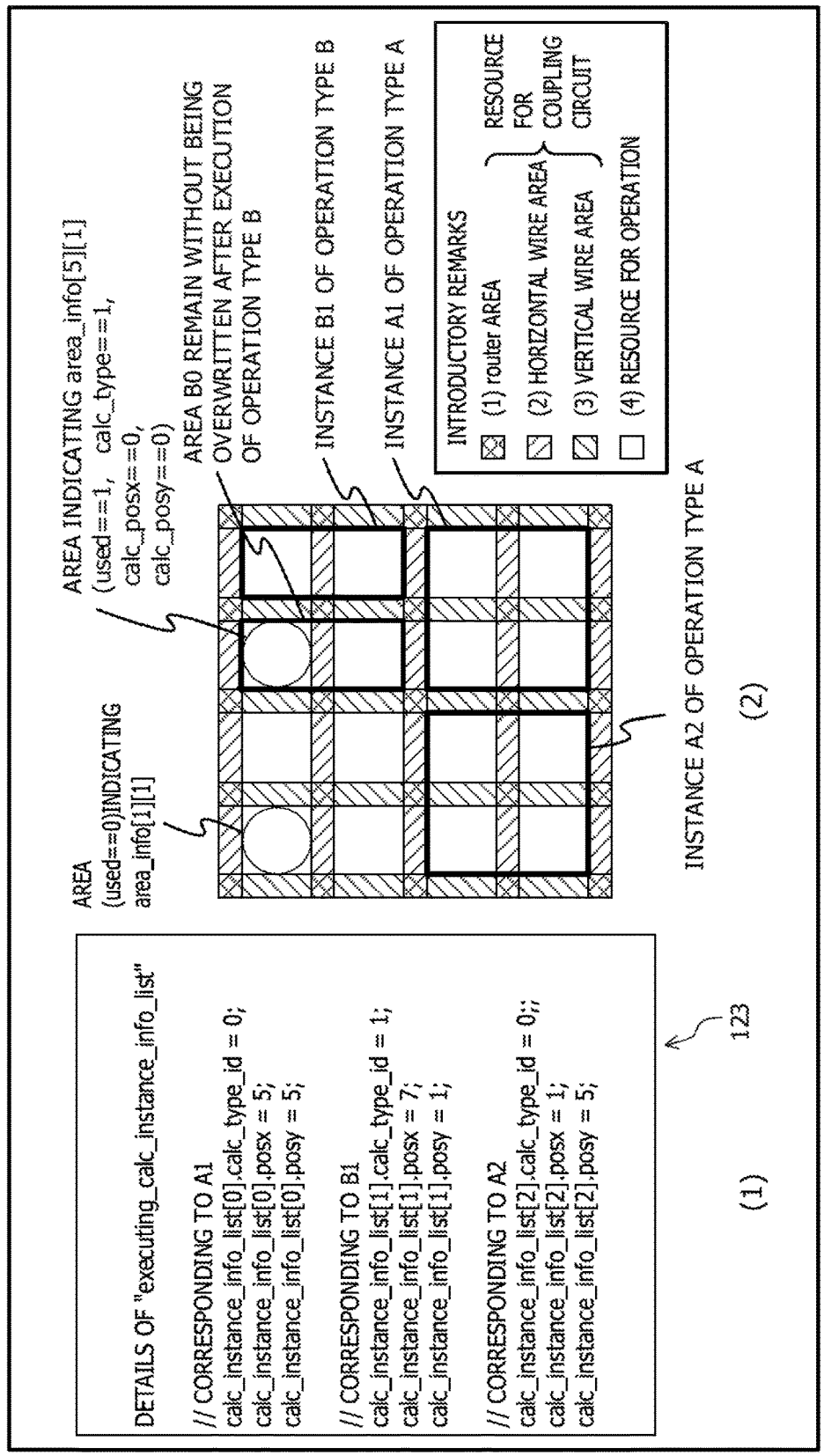
FIG. 8 illustrates active execution processing information in the operation processing device as the example of the first embodiment.

In the operation processing device 1, an indefinite number of instances of the "calc_instance_info_t" is managed using the "executing_calc_instance_info_list" (see FIG. 8). The "executing_calc_instance_info_list", for example, corresponds to a "list" and a "vector" in the standard template library (STL) of the C++ programming language.

FIG. 7 illustrates an initialization scheme of the FPGA 19 in the operation processing device 1 as the example of the first embodiment. In FIG. 7, the initialization scheme is represented by a program format in compliance with the C language. When the system starts up, nothing is written in the FPGA 19. The operational circuit generation unit 112 sets the coupling circuits (wire 31 and router 32) and the operational circuit area 33 to the "area_info" in the initialization process. In the example illustrated in FIG. 7, any of the router 32, the transverse wire 31a, the longitudinal wire 31b, and the operational circuit area 33 is set to each partial area 30 (see reference symbol P1). Thereafter, writing of the configuration information "noc_config_info[0]", which is for configuring the router 32, into the partial area 30 corresponding to the router 32, is performed. Similarly, writing of the configuration information "noc_config_info[1]", which is for configuring the transverse wire 31a, into the partial area 30 corresponding to the transverse wire 31a, and writing of the configuration information "noc_config_info[2]", which is for configuring the longitudinal wire 31b, into the partial area 30 corresponding to the longitudinal wire 31b are performed, respectively (see reference symbol P2).

A flag indicating that each partial area 30 is not used is set to each partial area 30 (see reference symbol P3). The "executing_calc_instance_info_list" becomes to a state where no elements exist (see reference symbol P4). With the process described above, the FPGA 19 is initialized. The initialization of the FPGA 19 indicated in FIG. 7 is embodied, for example, by an operational circuit generation unit 112 which will be described later.

FIG. 8 illustrates active execution processing information 123 in the operation processing device 1 as the example of the first embodiment. In FIG. 8, the reference symbol (2) illustrates a plurality of operation instances that are set in the FPGA 19. The reference symbol (1) illustrates details of an "executing_calc_instance_info_list" regarding a piece of information of the active execution operation instance indicated in the reference symbol (2).

In the example illustrated in FIG. 8, as illustrated in the reference symbol (2), three execution instances of operation instances A1, B1, and A2, and an area B0, which remains without being overwritten by other operational circuits after the execution of operation, is formed in the FPGA 19. The operation instances A1 and A2 are concerned with the operation type A and the operation instance B1 and the area B0 are concerned with the operation type B. As illustrated in the reference symbol (1), only an operation instance which is being executed is registered in the "executing_calc_instance_info_list". Accordingly, the area B0, which is pertaining to the operation process which remains without being overwritten after the execution of operation, is not registered in the "executing_calc_instance_info_list".

Regarding each operation instance which is being executed, a "calc_instance_info_list[n].calc_type_id", a "calc_instance_info_list[n].posx", and a "calc_instance_info_list[n].posy" (n=0, 1, 2) are registered in the "executing_calc_instance_info_list". That is, in the FPGA 19, the position of the operation instance which is being executed is grasped by referencing "executing_calc_instance_info_list" (active execution processing information 123).

(A-3) Functional Configuration

Figure 9:
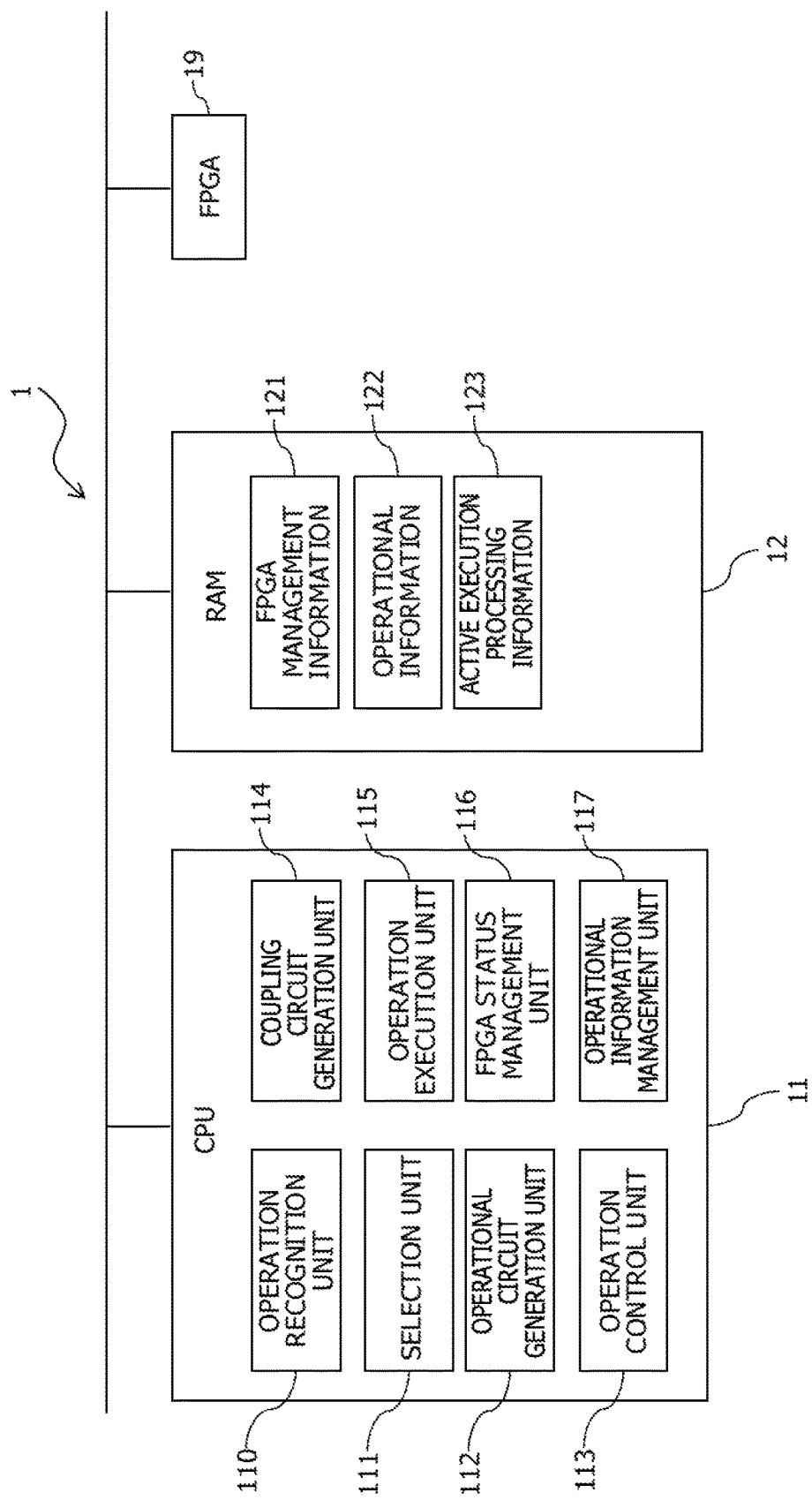
FIG. 9 illustrates a functional configuration of the operation processing device as the example of the first embodiment.

Next, the description will be made on a functional configuration of the operation processing device 1 equipped with the operation processing function of the first embodiment with reference to FIG. 9. FIG. 9 illustrates a functional configuration of the operation processing device 1 as the example of the first embodiment. The operation processing device 1 rewrites a circuit configuration of the FPGA 19, allocates the operation process to the FPGA 19, and executes the operation. The operation processing device 1 performs the operation processing function.

The operation processing device 1, as illustrated in FIG. 9, is equipped with at least functions as an operation recognition unit 110, a selection unit 111, an operational circuit generation unit 112, an operation control unit 113, a coupling circuit generation unit 114, an operation execution unit 115, an FPGA status management unit 116, and an operational information management unit 117. The operation recognition unit 110 recognizes an occurrence of an operation request to be processed in the FPGA 19. In the operation processing device 1, two or more types (for example, operation types A and B) of the operation to be processed in the FPGA 19 are determined in advance. In a case where the operation request for processing by the FPGA 19 occurs while a certain process is executed in the CPU 11, the operation recognition unit 110 recognizes the occurrence of the operation request.

When an occurrence of the operation request to be processed by the FPGA 19 is recognized by the operation recognition unit 110, the selection unit 111 selects an area to which the operation request is allocated in the FPGA 19. For example, the selection unit 111, confirms whether an operational circuit, which corresponds to the operation request and of which the operational circuit area 33 is in a state of being usable, exists or not in the FPGA 19. In a case where an operational circuit, which corresponds to the operation request, of which the operational circuit area 33 is in an usable state, and which is in a state of being unused (a state in which another operation process is not being executed), exists in the FPGA 19, the selection unit 111 selects the operational circuit resource group including the operational circuit area 33 as an area to which the operation request is to be allocated.

Even in a case where the operational circuit, which corresponds to the operation request and of which the operational circuit area 33 is in a state of being usable, does not exist in the FPGA 19, the selection unit 111 confirms whether the area, to which the operational circuit corresponding to the operation request is able to be allocated, exists or not. The selection unit 111 examines whether the operational circuit corresponding to the operation request is able to be formed without overlapping the area of the operational circuit pertaining to other operation requests being executed in the FPGA 19 or not. As a result of examination, in a case where whether the operational circuit corresponding to the operation request is able to be formed without overlapping the area of the operational circuit pertaining to other operation requests being executed, the selection unit 111 selects the operational circuit resource group including the operational circuit area 33 as an area in which the operational circuit is able to be formed.

Figure 10:
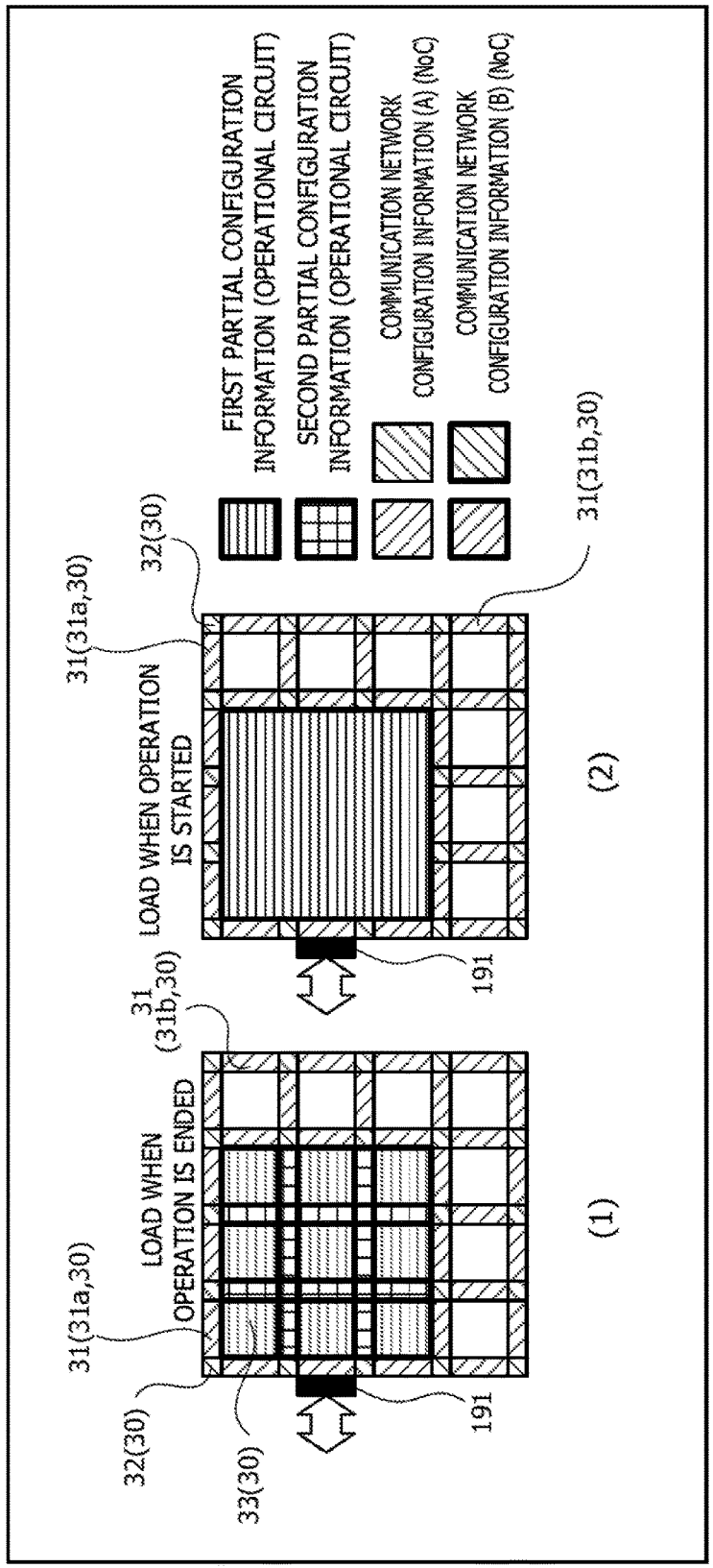
FIG. 10 is a diagram illustrating functions of an operational circuit generation unit in the operation processing device as the example of the first embodiment.

The operational circuit generation unit 112 forms the operational circuit corresponding to the operation request in the area selected by the selection unit 111. FIG. 10 is a diagram illustrating functions of the operational circuit generation unit 112 in the operation processing device 1 as the example of the first embodiment. In FIG. 10, the reference symbol (1) indicates a state before the operational circuit is formed in the FPGA 19 and indicates a state in which the selection unit 111 determines that an operational circuit, which corresponds to the operation request, of which the operational circuit area 33 is in an usable state, and which is in a state of being unused (a state in which another operation process is not being executed) exists in the FPGA 19.

As will be described later, the coupling circuit generation unit 114 sets a piece of configuration information configuring the wiring circuit or and a piece of configuration information configuring the router circuit to the first shared area 31 and the second shared area 32 that function as the operational circuit after the operation process is ended by the operational circuit so as to control the first shared area 31 and the second shared area 32 to function as a coupling circuit. That is, the coupling circuit generation unit 114 performs control of restoring (forming) the coupling circuit in the operational circuit of which the operation process is ended.

The operational circuit generation unit 112 sets the piece of configuration information configuring the operational circuit only to the partial area 30 corresponding to the coupling circuit to an operational circuit for which the coupling circuit is restored only and of which the operational circuit area 33 is not rewritten with other operational circuit (see reference symbol (1) of FIG. 10). With this, the operational circuit is reproduced as illustrated in the reference symbol (2) of FIG. 10. The operation control unit 113 causes the operational circuit formed in the FPGA 19 to execute processing pertaining to the operation request. A scheme for causing the operation processing to be executed in the FPGA 19 is already known and detailed descriptions thereof will be omitted.

The result of the operation processing executed by FPGA 19 is received and used by the CPU 11. The FPGA status management unit 116 manages a status of the FPGA 19. The FPGA status management unit 116 uses the FPGA management information 121 to manage how respective partial areas 30 on the FPGA 19 are used.

The operational information management unit 117 manages operational information 122. For example, the operational information management unit 117 manages a piece of information about an operation using the "calc_type_info" or the "calc_instance_info" described above. The coupling circuit generation unit 114 sets the piece of configuration information configuring the wiring circuit or the piece of configuration information configuring the router circuit (communication network configuration information) to the first shared area 31 and the second shared area 32 among the partial areas 30 functioned as the operational circuit after the operation process is ended so as to control the first shared area 31 and the second shared area 32 to function as the coupling circuit.

Figure 11:
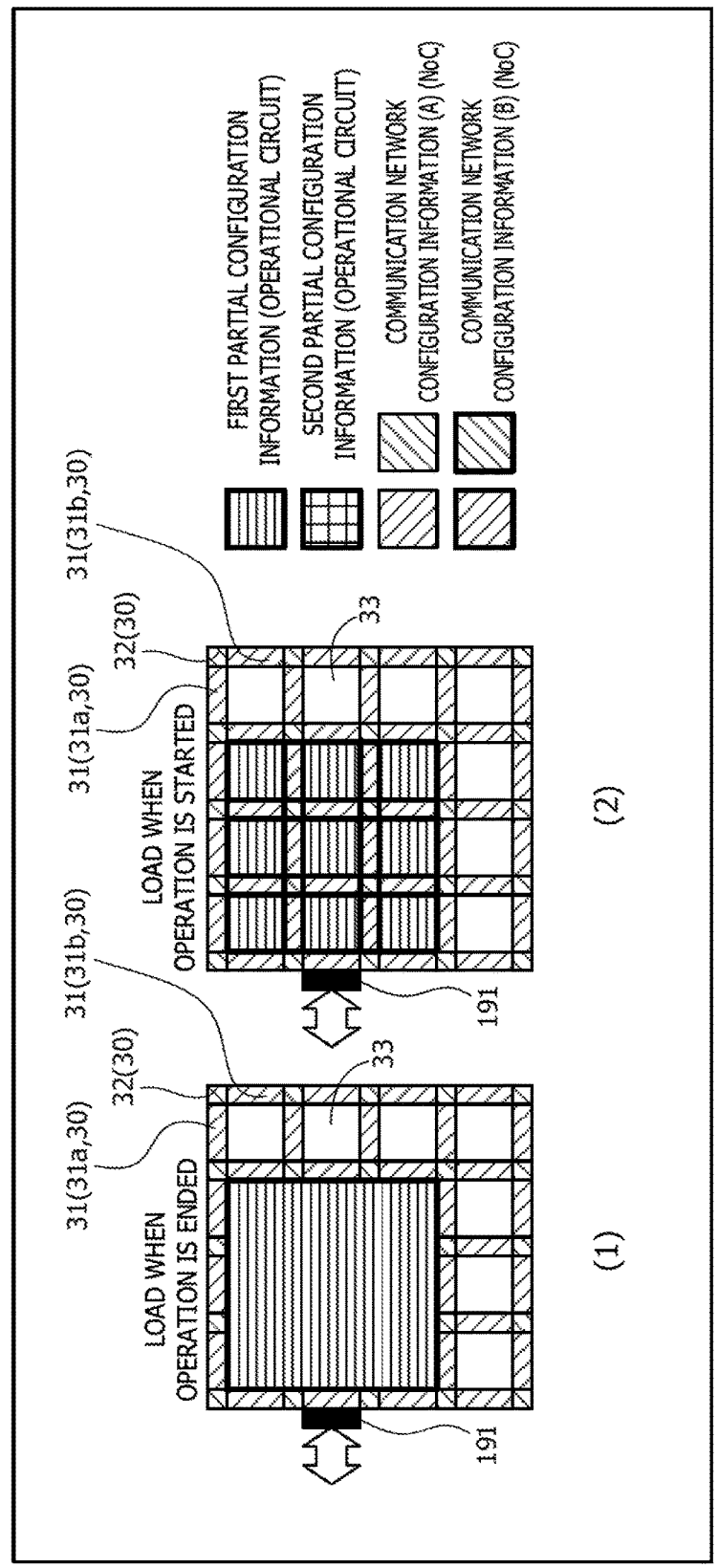
FIG. 11 is a diagram illustrating functions of a coupling circuit generation unit in the operation processing device as the example of the first embodiment.

FIG. 11 is a diagram illustrating functions of a coupling circuit generation unit 114 in the operation processing device 1 as the example of the first embodiment. In FIG. 11, the reference symbol (1) illustrates a state where the operational circuit is formed in the FPGA 19 and the operation process is being executed. The reference symbol (2) indicates a state after the operation process is completed. The coupling circuit generation unit 114, as illustrated in the reference symbol (2) of FIG. 11, sets the piece of configuration information configuring the wiring circuit to the first shared area 31 and the second shared area 32 so as to cause the first shared area 31 and the second shared area 32 to function as the wire area in the operational circuit in which the execution of the operation process is ended.

The coupling circuit generation unit 114 desirably defines the first shared area 31 and the second shared area 32 as the wire area, for example, before the operation recognition unit 110 recognizes an occurrence of next operation request. Accordingly, the coupling circuit generation unit 114 desirably defines the first shared area 31 and the second shared area 32 as the wire area, for example, immediately after the execution of the operation process is ended in the operational circuit. In a case where the operational circuit pertaining to the operation request was not able to be allocated to the FPGA 19, that is, in a case where the selection unit 111 was not able to select an area to which the operational circuit is to be set, the operation execution unit 115 executes a program in which the same process as the process to be performed by a specific circuit is described and which is executable by the CPU 11. With this, even when the specific circuit is not configured in the FPGA 19, the process to be performed by the specific circuit is executed by the CPU 11.

(A-4) Operation

Figure 12:
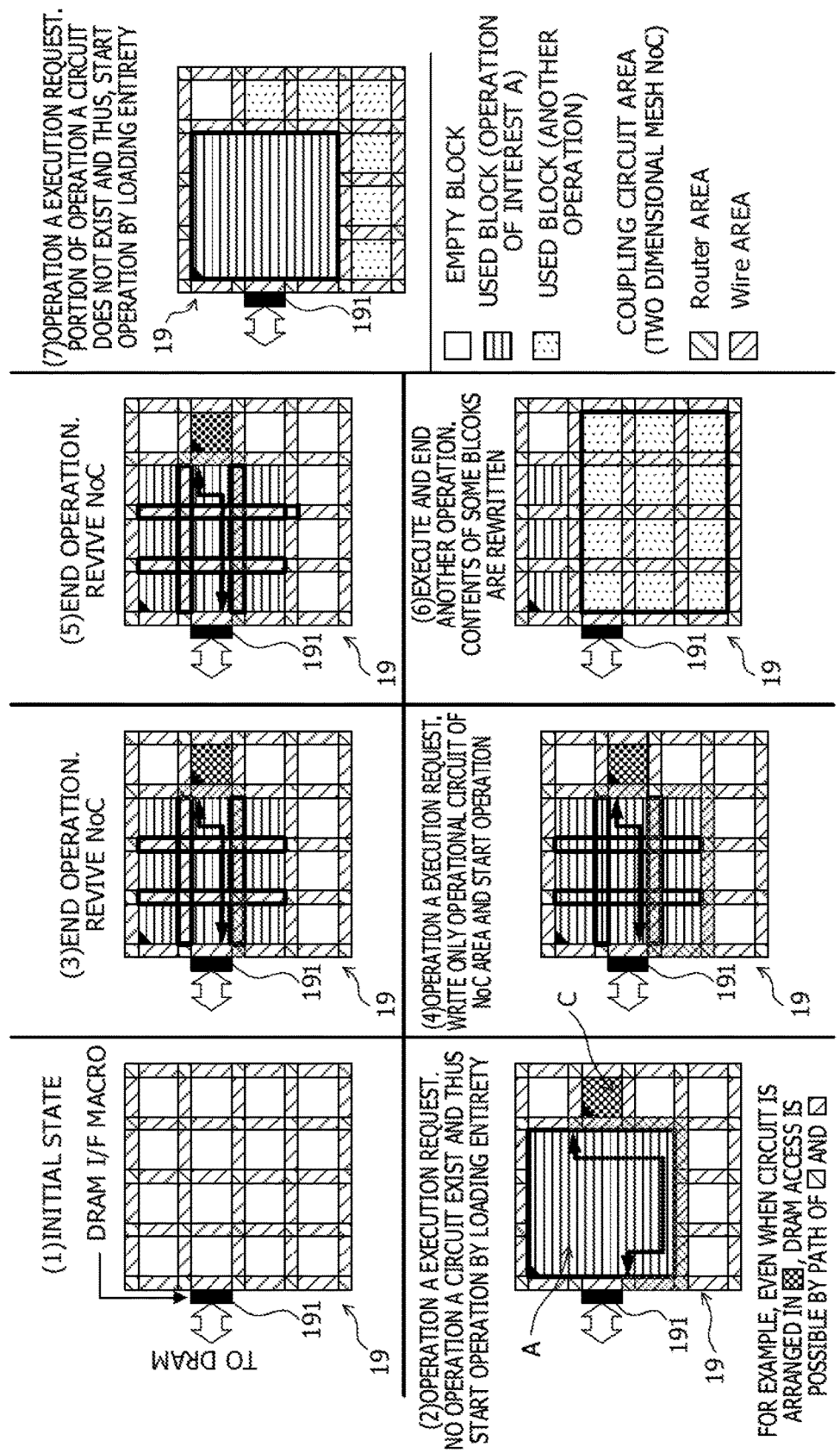
FIG. 12 is a diagram illustrating a method for forming the operational circuit onto the FPGA in the operation processing device as the example of the first embodiment.

First, a method for forming the operational circuit onto the FPGA 19 in the operation processing device 1 as the example of the first embodiment, which is configured as described above, will be described using FIG. 12. FIG. 12 is a diagram illustrating a method for forming an operational circuit onto the FPGA in the operation processing device as the example of the first embodiment. In an initial state, an operational circuit is not set in the FPGA 19 (see reference symbol (1)). When the operation recognition unit 110 recognizes an execution request for an operation A, the selection unit 111 confirms whether the operational circuit A capable of processing (executing) the operation A exists in a state of being unused on the FPGA 19.

In the example, the operational circuit A does not exist on the FPGA 19 and thus, the selection unit 111 selects an empty area in the FPGA 19 as an area in which the operational circuit is capable of being formed. The operational circuit generation unit 112 forms the operational circuit A corresponding to the operation request in the area selected by the selection unit 111 (see reference symbol (2)).

The operational circuit A is configured on the FPGA 19 by using a plurality of adjacent partial areas 30 (first shared area 31, second shared area 32, and operational circuit area 33).

A case where an operational circuit C is formed at a position adjacent to the operational circuit A in a state where the operational circuit A is formed on the FPGA 19 is considered. The router 32 positioned at the upper left of the operational circuit C and the external I/F 191 are coupled by a wire path which extends along the outer periphery of the operational circuit A to detour the operational circuit A. When the process by the operational circuit A is ended, the coupling circuit generation unit 114 sets a piece of configuration information configuring the wiring circuit or a piece of configuration information configuring the router circuit (communication network configuration information) to the first shared area 31 and the second shared area 32 that functioned as the operational circuit so as to revive the coupling circuit (NoC) (see reference symbol (3)).

With this, in the operational circuit C formed at the position adjacent to the operational circuit A, the router 32 positioned at the upper left of the operational circuit C and the external I/F 191 are coupled by a coupling circuit formed within the area of the operational circuit A. That is, the operational circuit C is coupled to the external I/F 191 by the shortest path. Thereafter, when the operation recognition unit 110 receives an execution request for the operation A again, the operational circuit generation unit 112 sets the piece of configuration information configuring the operational circuit to the area (wiring circuit portion) which was used as the coupling circuit in the operational circuit. With this, the operational circuit generation unit 112 reproduces the operational circuit A (see reference symbol (4)).

With this, the router 32 positioned at the upper left of the operational circuit C, which is formed at a position adjacent to the operational circuit A, and the external I/F 191 are coupled again by a wire path which extends along the outer periphery of the operational circuit A to detour the operational circuit A. When the process by the operational circuit A is ended, the coupling circuit generation unit 114 sets a piece of configuration information (communication network configuration information) configuring the wiring circuit or a piece of configuration information configuring the router circuit to the first shared area 31 and the second shared area 32 that functioned as the operational circuit so as to revive the coupling circuit (NoC) (see reference symbol (5)).

With this, in the operational circuit C formed at the position adjacent to the operational circuit A, the router 32 positioned at the upper left of the operational circuit C and the external I/F 191 are coupled by a coupling circuit formed within the area of the operational circuit A. That is, the operational circuit C is coupled to the external I/F 191 by the shortest path. Thereafter, another operation request is performed and some of operational circuit areas 33 used for configuring the operational circuit A are regarded as being rewritten by another operational circuit (see reference symbol (6)).

In this state, when the operation recognition unit 110 receives an execution request for the operation A, the operational circuit generation unit 112 sets the piece of configuration information configuring the operational circuit A to all areas 30 configuring the operational circuit A. With this, the operational circuit generation unit 112 reproduces the operational circuit A (see reference symbol (7)).

(A-4-1) Outline of Operation Process

Figure 13:
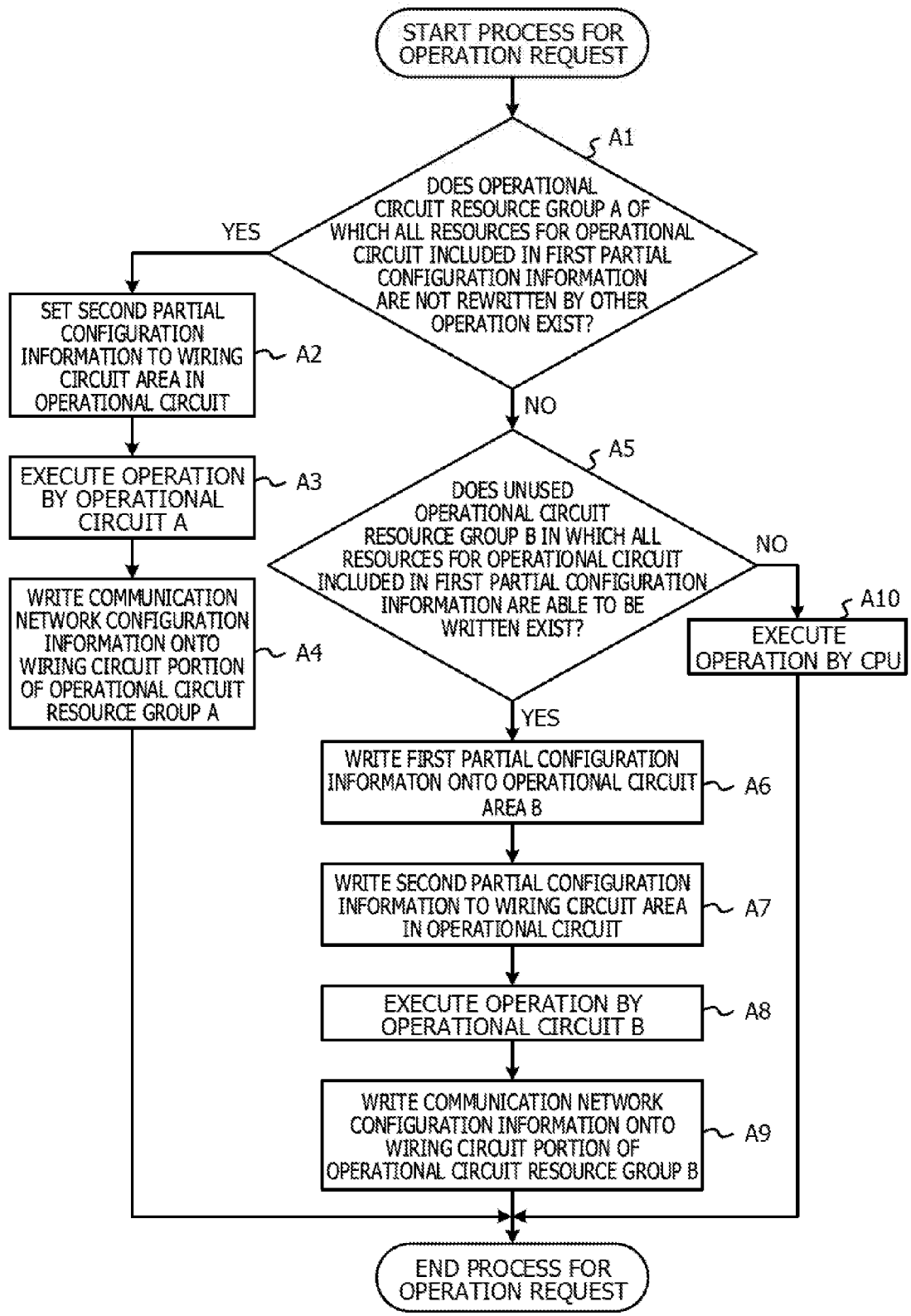
FIG. 13 is a flowchart illustrating an outline of a process for an operation request in the operation processing device as the example of the first embodiment.

Next, an outline of a process for an operation request in the operation processing device 1 as the example of the first embodiment configured as described above will be described according to a flowchart (Steps A1 to A10) illustrated in FIG. 13. FIG. 13 is a flowchart illustrating an outline of a process for an operation request in the operation processing device as the example of the first embodiment.

When the operation recognition unit 110 recognizes an occurrence of an operation request to be processed (in the following, referred to as operation request A) in the FPGA 19, in Step A1, the selection unit 111 confirms whether the operational circuit resource group (A) of the operational circuit, in which all operational circuit areas 33 (operational circuit resource group) are not rewritten by other operational circuit, exists in the FPGA 19. As a result of the confirmation, in a case where the operational circuit resource group A of the operational circuit exists on the FPGA 19 (see Yes route in Step A1), the process by the flowchart proceeds to Step A2.

In the operation processing device 1, the first shared area 31 and the second shared area 32 of the partial area 30 which was configuring the operational circuit are returned to the coupling circuit (wire area) by the coupling circuit generation unit 114 at the time when the operation process is ended in the operational circuit. In Step A2, the coupling circuit generation unit 114 sets the operational circuit configuration information (second partial configuration information) only to a coupling circuit portion of the operational circuit resource group A of the operational circuit on the FPGA 19. With this, the operational circuit is reproduced onto the FPGA 19 using the operational circuit resource group A.

In Step A3, the operation control unit 113 causes the operational circuit which is reproduced in the FPGA 19 to execute processing pertaining to the operation request. In Step A4, the coupling circuit generation unit 114 sets the coupling circuit configuration information only to a wiring circuit portion of the operational circuit resource group A of the operational circuit on the FPGA 19. With this, the first shared area 31 and the second shared area 32 of the partial area 30 which was configuring the operational circuit are returned to the coupling circuit (wire area) by the coupling circuit generation unit 114. Thereafter, the process by the flowchart is ended.

On the other hand, as a result of the confirmation in Step A1, in a case where the operational circuit resource group A of the operational circuit, which satisfies the condition of Step A1, does not exist on the FPGA 19 (see No route in Step A1), the process by the flowchart proceeds to Step A5. In Step A5, the selection unit 111 confirms whether the operational circuit resource group (B) of the operational circuit, in which all operational circuit areas 33 (operational circuit resource group) which are capable of being written and not used by other operational circuits, exists in the FPGA 19.

As a result of the confirmation, in a case where the operational circuit resource group B of the operational circuit, which satisfies the condition of Step A5, exists on the FPGA 19 (see Yes route in Step A5), the process by the flowchart proceeds to Step A6. In Step A6, the operational circuit generation unit 112 sets the operational circuit configuration information (first partial configuration information) to the operational circuit area 33 of the operational circuit resource group B of the operational circuit on the FPGA 19.

In Step A7, the coupling circuit generation unit 114 sets the operational circuit configuration information (second partial configuration information) only to a coupling circuit portion of the operational circuit resource group B of the operational circuit on the FPGA 19. With this, the operational circuit is reproduced onto the FPGA 19 using the operational circuit resource group B. In Step A8, the operation control unit 113 causes the operational circuit which is reproduced in the FPGA 19 to execute the process pertaining to the operation request.

In Step A9, the coupling circuit generation unit 114 sets the operational circuit configuration information only to the wiring circuit portion of the operational circuit resource group B of the operational circuit on the FPGA 19. With this, the first shared area 31 and the second shared area 32 of the partial area 30 which was configuring the operational circuit are returned to the coupling circuit (wire area) by the coupling circuit generation unit 114. Thereafter, the process by the flowchart is ended.

As a result of the confirmation in Step A5, in a case where the operational circuit resource group B of the operational circuit, which satisfies the condition of Step A5, does not exist on the FPGA 19 (see No route in Step A5), the operation request is not able to be processed by the FPGA 19. In Step A10, the operation execution unit 115 processes the operation request. Thereafter, the process by the flowchart is ended.

(A-4-2) Details of a Process for Operation Request

Figure 14:
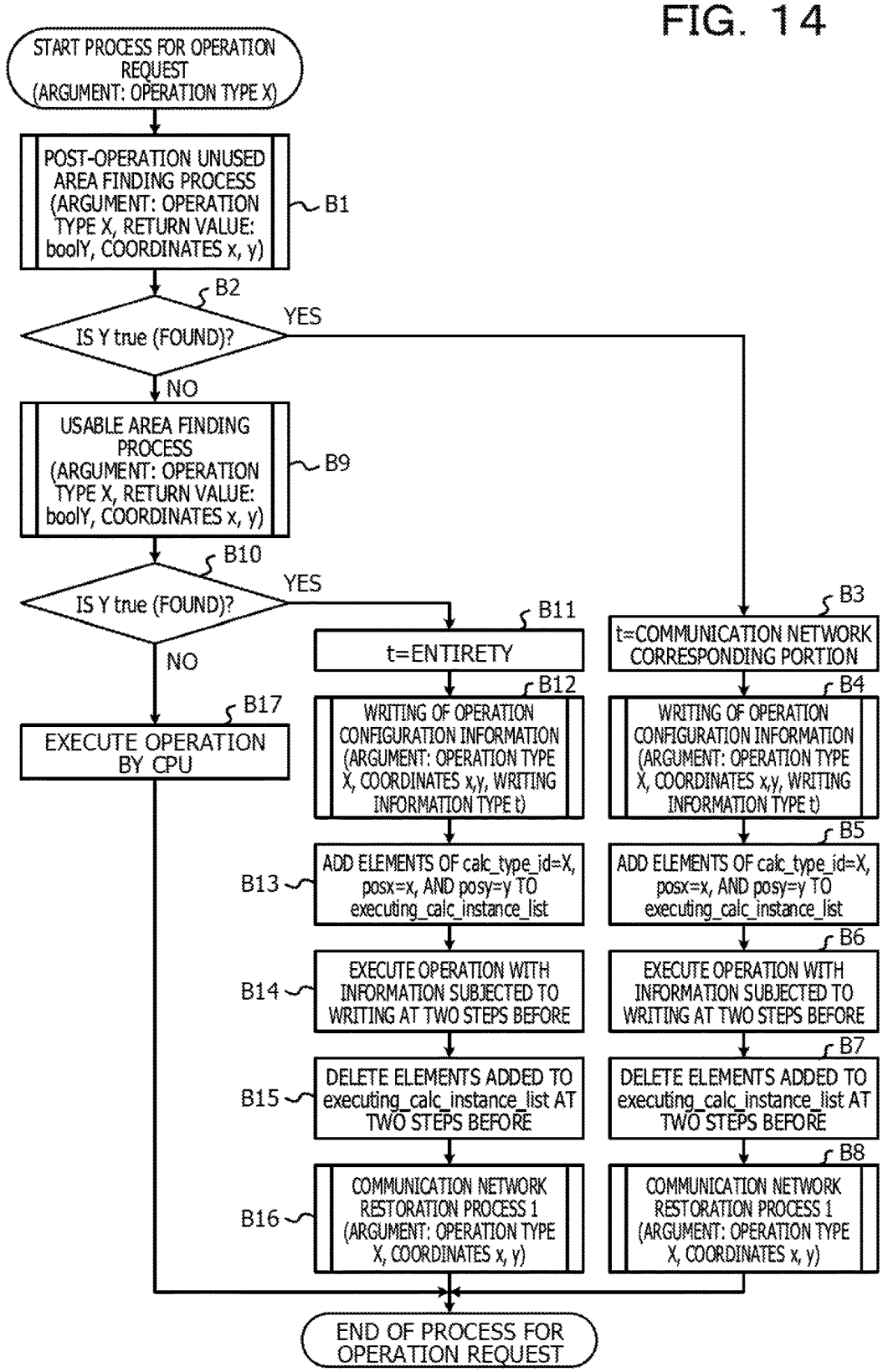
FIGS. 14, 15, 16, 17, 18, and 19 are flowcharts illustrating details of the process for the operation request in the operation processing device as the example of the first embodiment.

Next, details of the process for an operation request in the operation processing device 1 as the example of the first embodiment configured as described above will be described according to flowcharts illustrated in FIGS. 14, 15, 16, 17, 18, and 19. FIGS. 14, 15, 16, 17, 18, and 19 are flowcharts illustrating details of the process for an operation request in the operation processing device as the example of the first embodiment. FIG. 14 is a flowchart (Steps B1 to B17) illustrating the flow of the process for the operation request in its entirety and an operation type X pertaining to the operation request is used as an argument.

Figure 15:
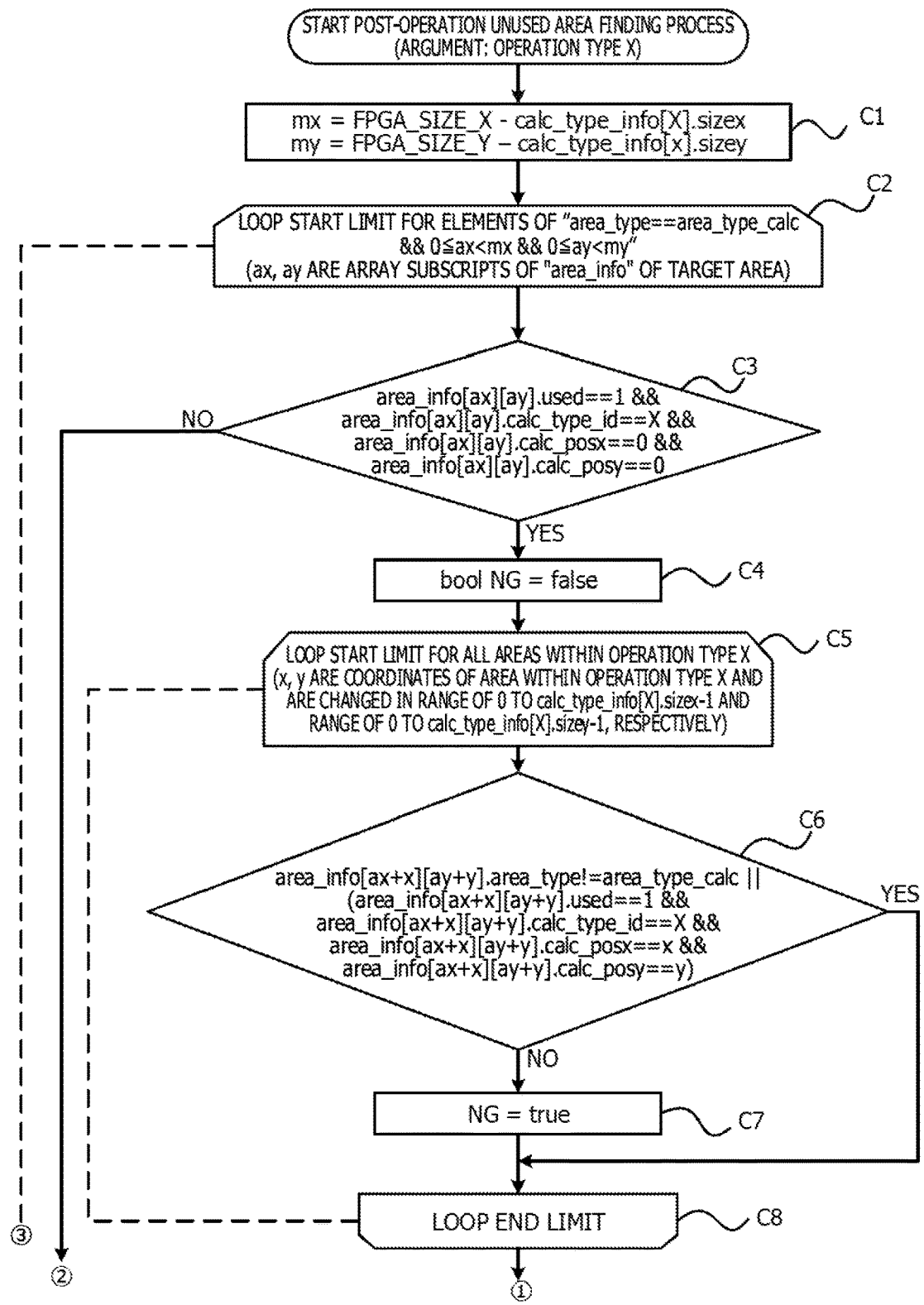
Figure 16:
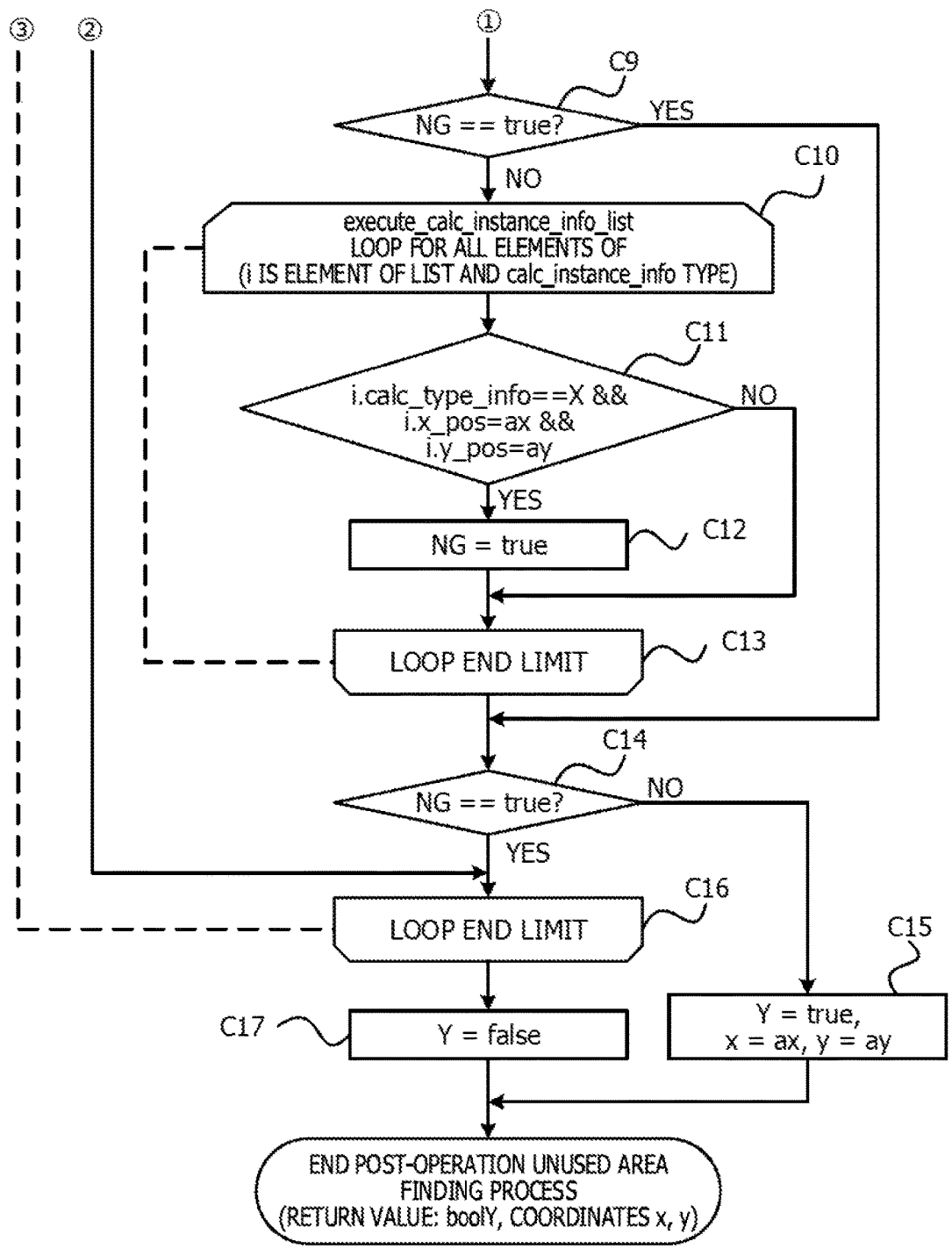
Figure 17:
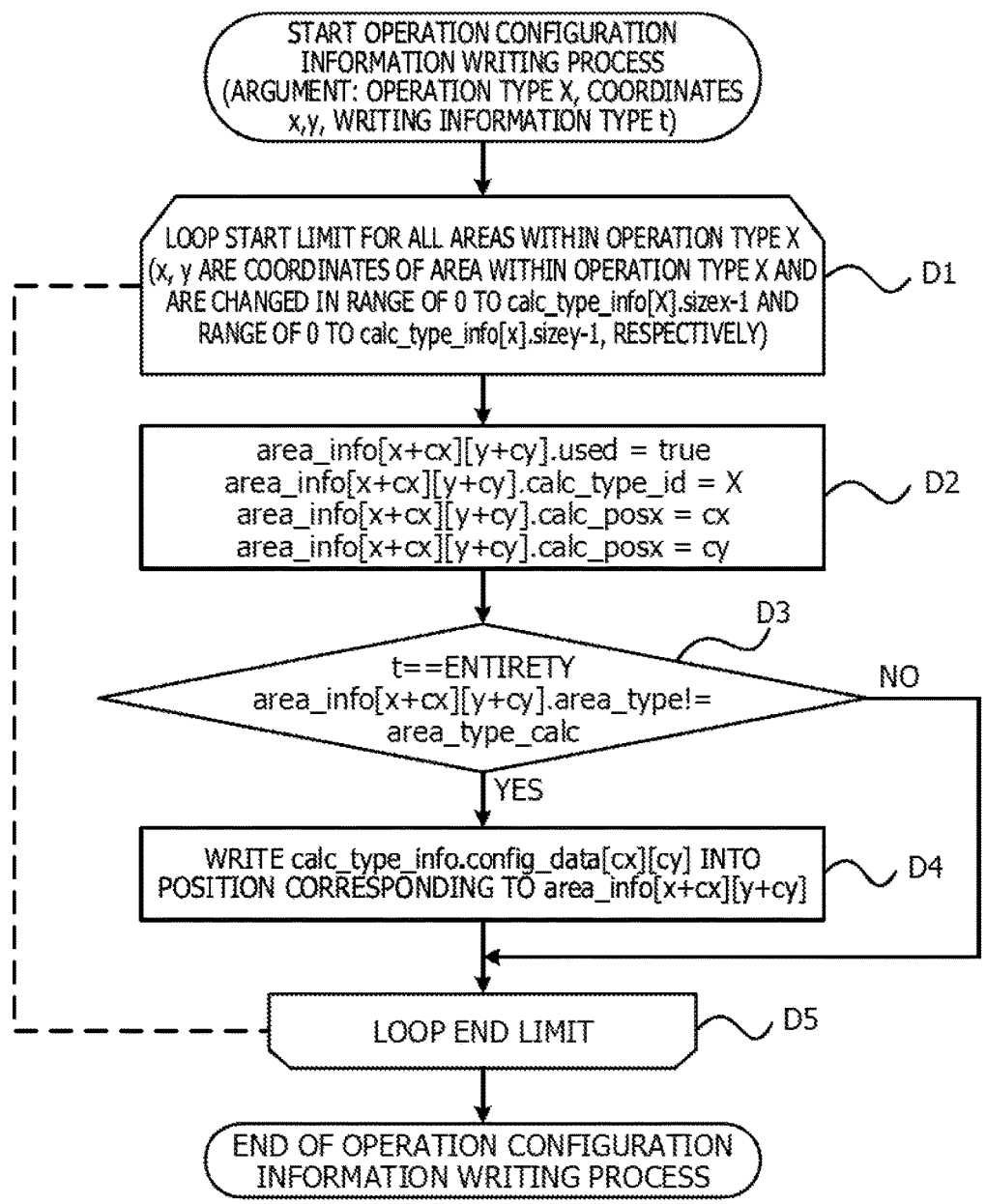
Figure 18:
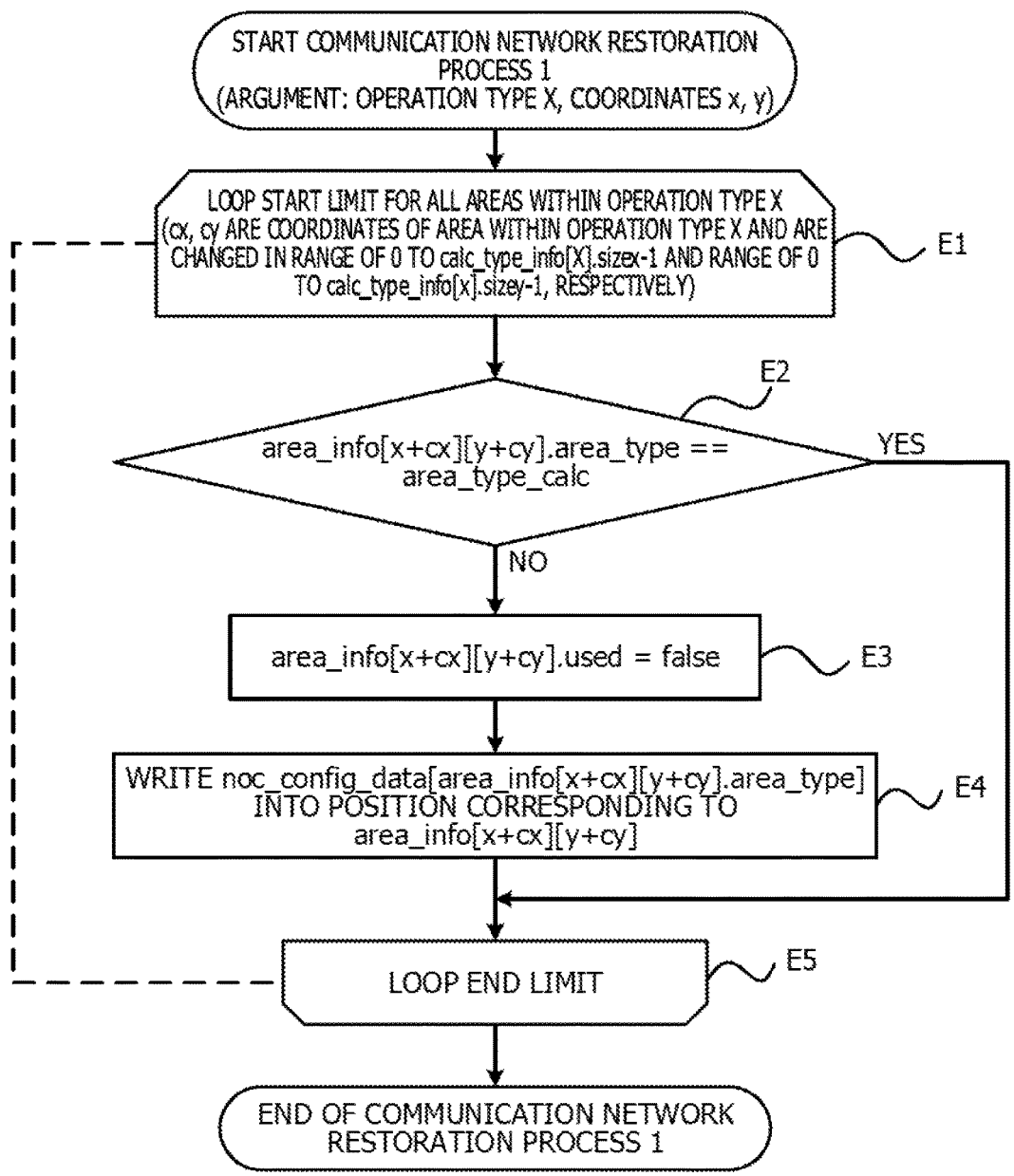
Figure 19:
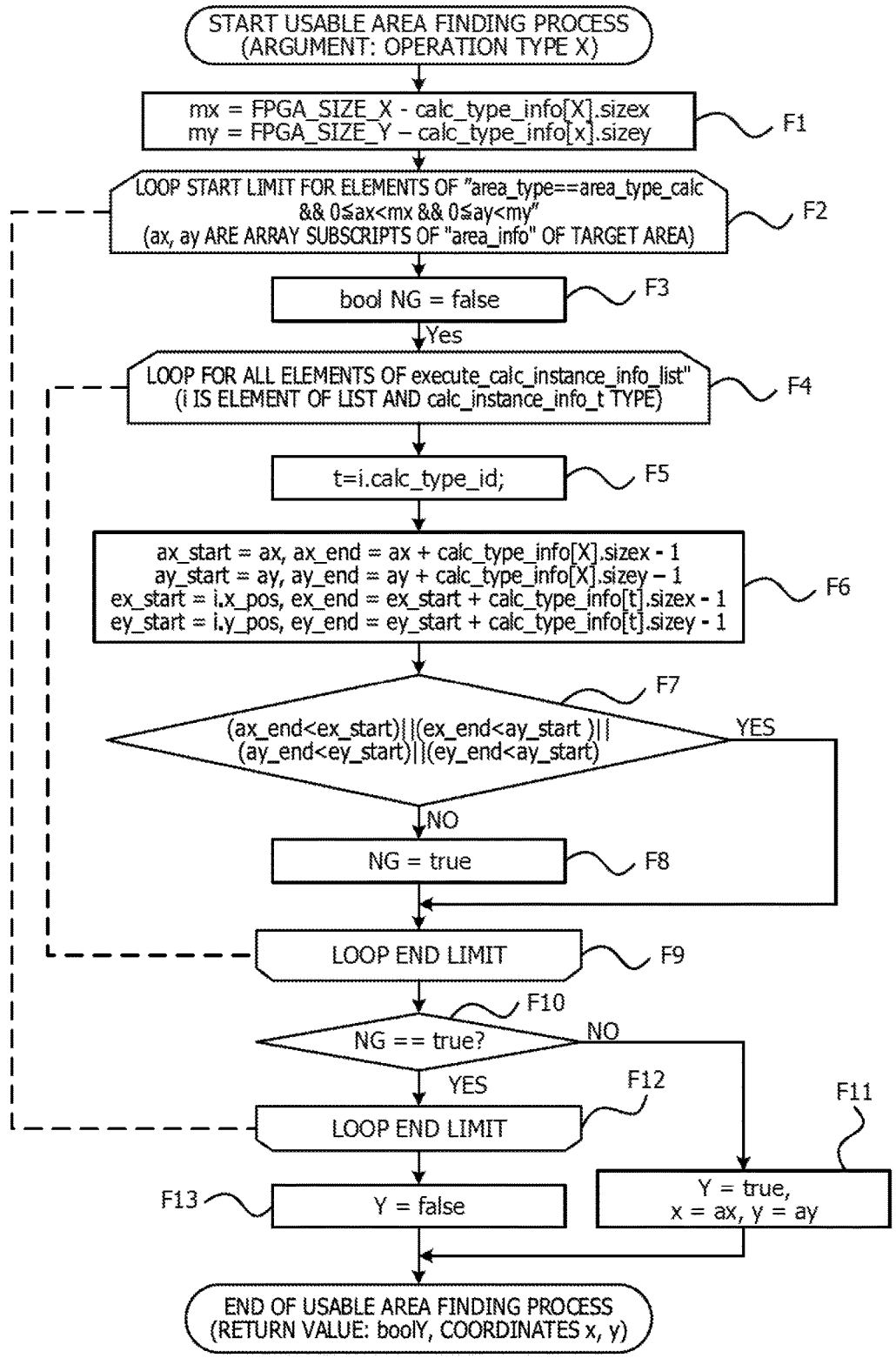

FIGS. 15 and 16 are flowchart illustrating details of a process for a post-operation unused area finding process after operation. FIGS. 15 and 16 illustrate Steps C1 to C8 and Steps C9 to C17, respectively. FIG. 17 is a flowchart illustrating details of an operation configuration information writing process (Steps D1 to D5). FIG. 18 is a flowchart illustrating details of a communication network restoration process (Steps E1 to E5). FIG. 19 is a flowchart illustrating a usable area finding process (Steps F1 to F13).

First, the post-operation unused area finding process is performed in Step B1 of FIG. 14. The post-operation unused area finding process is a process for finding a post-operation unused area and is mainly executed by the selection unit 111. The unused area after operation is an area (operational circuit resource group) which is in a state where the operational circuit area 33 of the operational circuit pertaining to the operation request is maintained and is an area not used (unused) by another operation process which is being executed. Details of the post-operation unused area finding process will be described using FIGS. 15 and 16 later.

When the post-operation unused area finding process is executed, an operation type X is used as an argument. The post-operation unused area finding process is executed to thereby obtain a boolY and the coordinates x and y as return values. The boolY is a value representing true or false and in a case where an unused area, to which the operational circuit is able to be allocated on the FPGA 19, is found, true is set in the unused area and otherwise, in a case where the unused area is not found, false is set in the unused area. The coordinates x and y represent a position of an unused area, to which the operational circuit is able to be allocated, on the FPGA 19 when the unused area is found.

In Step B2 of FIG. 14, it is confirmed whether a return value Y in Step B1 is true, that is, an area, to which the operational circuit is able to be allocated, is found. As a result of the confirmation in Step B2, in a case where an area, to which the operational circuit is able to be allocated, is found, that is, in a case where Y=true (see Yes route in Step B2), the process by the flowchart proceeds to Step B3 of FIG. 14.

In Step B3, a communication network corresponding portion is set as a type of write information t. In Step B4, a writing process of a piece of operation configuration information is performed. Details of the writing process of the operation configuration information will be described using FIG. 17 later. When the writing process of the operation configuration information is executed, the operation type X, the coordinates x and y, and the type of write information t are used as arguments.

Thereafter, in Step B5 of FIG. 14, elements of the calc_type_id=X, the posx=x, and the posy=y are added to the executing_calc_instance_info_list as a piece of information of an operation which is being executed. In Step B6 of FIG. 14, the operation is executed with a piece of information subjected to writing at two steps before Step B6, that is, Step B4. After the operation is ended, the elements of the calc_type_id=X, the posx=x, and the posy=y added to the executing_calc_instance_info_list in Step B5 are deleted in Step B7.

In Step B8 of FIG. 14, the communication network restoration process is performed. Details of the communication network restoration process will be described using FIG. 17 later. When the communication network restoration process is executed, the operation type X and the coordinates x and y are used as an argument. Thereafter, the process by the flowchart is ended. On the other hand, as a result of the confirmation in Step B2, in a case where an area, to which the operational circuit is able to be allocated, is not found, that is, in a case where Y=false (see No route in Step B2), the process by the flowchart proceeds to Step B9 of FIG. 14.

In Step B9, a usable area finding process is performed. The usable area finding process is mainly executed by the selection unit 111. Details of the usable area finding process will be described using FIG. 19 later. When the usable area finding process is executed, the operation type X is used as an argument. The usable area finding process is executed to thereby obtain the boolY and the coordinates x and y as the return values.

In Step B10 of FIG. 14, it is confirmed whether a return value Y is true, that is, an area, to which the operational circuit is able to be allocated, is found. As a result of the confirmation in Step B10, in a case where an area, to which the operational circuit is able to be allocated, is found, that is, in a case where Y=true (see Yes route in Step B10), the process by the flowchart proceeds to Step B11 of FIG. 14.

In Step B11, the entirety of the partial area 30 included in the operational circuit is set as the type of write information t. In Step B12, the writing process of a piece of operation configuration information is performed. Details of the writing process of the operation configuration information will be described using FIG. 17 later. When the writing process of the operation configuration information is executed, the operation type X, the coordinates x and y, and the type of write information t are used as arguments.

Thereafter, in Step B13 of FIG. 14, elements of the "calc_type_id=X", the "posx=x, posy=y" are added to the "executing_calc_instance_info_list" as a piece of information of an operation which is being executed. In Step B14 of FIG. 14, the operation is executed with a piece of information subjected to writing at two steps before Step B14, that is, Step B12. After the operation is ended, the elements of the "calc_type_id=X", the "posx=x", and the "posy=y" added to the "executing_calc_instance_info_list" in Step B13 of FIG. 14 are deleted in Step B15.

In Step B16 of FIG. 14, the communication network restoration process is performed. Details of the communication network restoration process will be described using FIG. 17 later. When the communication network restoration process is executed, the operation type X and the coordinates x and y are used as an argument. Thereafter, the process by the flowchart is ended. On the other hand, as a result of the confirmation in Step B10, in a case where an area, to which the operational circuit is able to be allocated, is not found, that is, in a case where Y=false (see No route in Step B10), the operation request is executed by the CPU 11 (Step B17 of FIG. 14), and the process by the flowchart is ended.

(A-4-3) Post-Operation Unused Area Finding Process

Next, a post-operation unused area finding process in the operation processing device 1 as the example of the first embodiment configured as described above will be described according to a flowchart (Steps C1 to C17) illustrated in FIGS. 15 and 16. In Step C1 of FIG. 15, "mx=FPGA_SIZE_X-calc_type_info[X].sizex" and "my=FPGA_SIZE_Y-calc_type_info[x].sizey" are set. With this, an area used as the upper left position of the operational circuit resource group to be verified is set as an operational circuit for executing the operation type X.

In Step C2 of FIG. 15, a loop process, in which control from Step C2 to Step F8 is repeatedly performed for all elements of "area_type==area_type_calc and 0≤ax<mx&&0≤ay<my" within the "area_info", is started. The ax and ay are array subscripts of the "area_info" of a target area.

In Step C3 of FIG. 15, it is confirmed whether "area_info [ax][ay].used==1" and "area_info[ax][ay].calc_type_id==X" and "area_info[ax][ay].calc_posx==0", and "area_info[ax][ay].calc_posy==0".

That is, it is confirmed whether the operational circuit area 33 is the operational circuit regarding the operation type X pertaining to the operation request and is an area (0, 0) corresponding to the reference position of the upper left corner in the operational circuit. In a case where the above-described condition is not satisfied (see No route in Step C3), the process by the flowchart proceeds to Step C16.

On the other hand, in a case where the above-described condition is satisfied (see Yes route in Step C3), the variable NG is set to false in Step C4 of FIG. 15. Thereafter, the process by the flowchart proceeds to Step C5 of FIG. 15.

In Step C5, a loop process in which control of Steps C6 and C7 is repeatedly performed is started for all partial areas 30 within the operation type X.

The x and y are the coordinates of the area within the operation type X and are changed in a range of 0 to calc_type_info[X]/sizex-1 and a range of 0 to calc_type_info[x]/sizey-1, respectively. In Step C6 of FIG. 15, the selection unit 111 checks whether all operational circuit areas 33 are provided in an area (hereinafter, referred to as a target area) corresponding to the operational circuit of a target operation type (in the example, operation type X).

That is, it is determined whether either of Condition (1): area_info[ax+x][ay+y].area_type!=area_type_calc, or, Condition (2): area_info[ax+x][ay+y].used==1 and area_info [ax+x][ay+y].calc_type_id==X and area_info[ax+x][ay+y]. calc_posx==x, and area_info[ax+x][ay+y].calc_posy==y is satisfied. In the Condition (1), it is confirmed whether all partial areas 30 included within the target area are the operational circuit areas 33.

In the Condition (2), it is confirmed whether each partial area 30 included within the target area is the operational circuit of the operation type X and is also a partial operational circuit at a position of interest in the operational circuit. As a result of the confirmation in Step C6, in a case where any of the Condition (1) and Condition (2) is not satisfied (see No route in Step C6), the variable NG is set to true in Step C7 of FIG. 15. Thereafter, in Step C8 of FIG. 15, a loop limit process corresponding to Step C5 is performed. When the confirmation process whether all operational circuit area 33 of the operational circuit of the operation type X are provided for all partial areas 30 within the operation type X is completed, the process by the flowchart proceeds to Step C9.

As a result of the confirmation in Step C6, in a case where at least one of the Condition (1) and Condition (2) is satisfied (see Yes route in Step C6), the process skips Step C7 and proceeds to Step C8. In Step C9 of FIG. 16, it is confirmed whether the NG is set to true. In a case where the NG is set to false (see No route in Step C9), the process by the flowchart proceeds to Step C10 of FIG. 16. In a case where the NG is set to true (see Yes route in Step C9), the process by the flowchart proceeds to Step C14 of FIG. 16.

In Step C10, a loop process, in which control of Steps C11 to C13 of FIG. 16 is repeatedly performed for all operation processing being executed and registered in the "execute_ calc_instance_info_list", is started. That is, it is confirmed whether a found area is not used by another operation instance (operational circuit) which is being executed. In Step C11, it is confirmed whether i.calc_type_info==X and i.x_pos=ax and i.y_pos=ay. With this, it is confirmed whether the target area is not registered in the "execute$_{13}$calc_instance_info_list".

As a result of the confirmation, in a case where the target area is registered in the "execute_calc_instance_info_list", that is, in a case where the target area is used by another operation instance which is being executed (see Yes route in Step C11), the process by the flowchart proceeds to Step C12. In Step C12, the flag NG is set to true. Thereafter, the process by the flowchart proceeds to Step C13. In Step C13, a loop limit process corresponding to Step C10 is performed. When the process regarding all operation processing being executed and registered in the "execute_calc_instance_info_list" is completed, the process by the flowchart proceeds to Step C14.

On the other hand, in a case where the target area is not registered in the "execute_calc_instance_info_list" (see No route in Step C11), the process skips Step C12 and proceeds to Step C13. In Step C14 of FIG. 16, it is confirmed whether the NG is set to true. In a case where the NG is not set to true, that is, the NG is set to false (see No route in Step C14), the process by the flowchart proceeds to Step C15 of FIG. 16. In Step C15, Y(boolY) is set to true and also x=ax, y=ay are set. Thereafter, the process by the flowchart proceeds to Step B2 of FIG. 14.

That is, as a result of the confirmation in Step C11, in a case where the operational circuit resource group which is not used by another operation instance, the post-operation unused area finding process is ended as quickly as possible. As a result of the confirmation in Step C14, in a case where the NG is set to true (see Yes route in Step C14), the process by the flowchart proceeds to Step C16 of FIG. 16. In Step C16, the loop limit process corresponding to Step C2 is performed. When the process regarding all the operational circuit areas 33 included in the FPGA 19 is completed, the process by the flowchart proceeds to Step C17 of FIG. 16.

In Step C17, the Y(boolY) is set to false. Thereafter, the process is ended, and proceeds to Step B2 of the flowchart of FIG. 14.

(A-4-4) Operation Configuration Information Writing Process

Next, an operation configuration information writing process in the operation processing device 1 as the example of the first embodiment will be described according to a flowchart (Steps D1 to D5) illustrated in FIG. 17.

In Step D1 of FIG. 17, a loop process in which control from D1 to Step D4 is repeatedly performed for all the partial areas 30 included within the operational circuit of the operation type X is started. The cx and cy are the coordinates of the area within the operation type X and are changed in a range of 0 to calc_type_info[X]/sizex−1 and a range of 0 to calc_type_info[x]/sizey−1, respectively. In Step D2 of FIG. 17, the "area_info" is updated. That is, the area_info[x+cx][y+cy].used is set to true, the area_info[x+cx][y+cy].calc_type_id is set to X, the area_info[x+cx][y+cy].calc_posx is set to cx, and the area_info[x+cx][y+cy].calc_posx is set to cy.

In Step D3 of FIG. 17, it is determined whether any of Condition (1): t==entirety, or Condition (2): area_info[x+cx][y+cy].area_type is not area_type_calc is satisfied. In a case where at least one of the Condition (1) and Condition (2) is satisfied (see Yes route in Step D3), the process by the flowchart proceeds to Step D4 of FIG. 17. In Step D4, the calc_type_info.config_data[cx][cy] is written into a position corresponding to the area_info[x+cx][y+cy].

In a case where any of the Condition (1) and Condition (2) is not satisfied (see No route in Step D3), the process by the flowchart proceeds to Step D5 of FIG. 17. In Step D5 of FIG. 17, the loop limit process corresponding to Step D1 is performed. When the process for all partial areas 30 included in the operational circuit is completed, the process by the flowchart proceeds to Step B5 or Step B13 of the flowchart illustrated in FIG. 14.

(A-4-5) Communication Network Restoration Process

Next, a communication network restoration process in the operation processing device 1 as the example of the first embodiment will be described according to a flowchart (Steps E1 to E5) illustrated in FIG. 18. The following process is mainly performed by the coupling circuit generation unit 114. In Step E1 of FIG. 18, a loop process in which control from Step E1 to Step E4 is repeatedly performed for all partial areas 30 included within the operational circuit of the operation type X is started.

The cx and cy are the coordinates of the area within the operation type X and are changed in a range of 0 to calc_type_info[X]/sizex−1 and a range of 0 to calc_type_info[x]/sizey−1, respectively. In Step E2 of FIG. 18, it is confirmed whether the area_info[x+cx][y+cy].area_type is the area_type_calc. As a result of the confirmation, in a case where the area_info[x+cx][y+cy].area_type is not the area_type_calc (see No route in Step E2), the process by the flowchart proceeds to Step E3 of FIG. 18

In Step E3, the area_info[x+cx][y+cy].used=false is set. Thereafter, In Step E4 of FIG. 18, the noc_config_data[area_info[x+cx][y+cy].area_type] is written into the position corresponding to the area_info[x+cx][y+cy]. With this, the first wire 31 or the router 32 is formed in the first shared area 31 and the second shared area 32 in the operational circuit and the coupling circuit is restored.

As a result of the confirmation in Step E2, in a case where the area_info[x+cx][y+cy].area_type coincides with the area_type_calc (see Yes route in Step E2), the process by the flowchart proceeds to Step E5 of FIG. 18. In Step E5 of FIG. 18, the loop limit process corresponding to Step E1 is performed. When the process for all partial areas 30 included in the operational circuit is completed, the process in the flowchart illustrated in FIG. 18 is ended, and the process in the flowchart illustrated in FIG. 14 is ended.

(A-4-6) Finding of Usable Area

Next, the usable area finding process in the operation processing device 1 as the example of the first embodiment will be described according to a flowchart (Steps F1 to F13) illustrated in FIG. 19. In Step F1 of FIG. 19, mx=FPGA_SIZE_X−calc_type_info[X].sizex and my=FPGA_SIZE_Y−calc_type_info[x].sizey are set. With this, an area used as the upper left position of the operational circuit resource group to be verified is set as an operational circuit for executing the operation type X.

In Step F2 of FIG. 19, a loop process, in which control from Step F2 to Step F8 is repeatedly performed for all elements of "area_type—area_type_calc and 0≤ax<mx&&0≤ay<my" within the "area_info", is started. The ax and ay are array subscripts of the "area_info" of a target area. In Step F3 of FIG. 19, the boolNG=false is set. In Step F4 of FIG. 19, a loop process, in which control from Step F5 to Step F8 is repeatedly performed for all elements of the "execute_calc_instance_info_list" is started. That is, it is confirmed whether a secured area (partial area 30) does not overlap an operation instance which is already being executed. The "i" is an element of a list and has a type of the calc_instance_info_t.

In Step F5 of FIG. 19, t=i.calc_type_id is set. In Step F6 of FIG. 19, ax_start=axax_end=ax+calc_type_info[X].sizex−1, ay_start=ayay_end=ay+calc_type_info[X].sizey−1, ex_start=i.x_pos, ex_end=ex_start+calc_type_info[t].sizex−1, ey_start=i.y_pos, and ey_end=ey_start+calc_type_info[t].sizey−1 are respectively set.

The "ax_start" is a left end position of an operational circuit resource group to be verified, the "ax_end" is a right end position of an operational circuit resource group to be verified, the "ay_start" is an upper end position of an operational circuit resource group to be verified, and the "ay_end" is an lower end position of an operational circuit resource group to be verified.

Also, the "ex_start" is a left end position of the operational circuit resource group in which an operation is being executed, the "ex_end" is a right end position of the operational circuit resource group in which an operation is being executed, the "ey_start" is an upper end position of the operational circuit resource group in which an operation is being executed, and the "ey_end" is a lower end position of the operational circuit resource group in which an operation is being executed.

Respective positions of end portions of these operational circuit resource groups to be verified are compared with those of the operational circuit resource groups, in which the operations are being executed, in magnitude to determine an overlap relationship between operational circuit resource groups to be verified and the operational circuit resource groups in which the operations are being executed. In Step F7, it is confirmed whether at least one of Condition (1):ax_end<ex_start, or Condition (2): ex_end<ay_start, or Condition (3): ay_end<ey_start, or Condition (4): ey_end<ay_start is satisfied. With this, it is confirmed that an overlap between the operational circuit resource groups to be verified and the partial area 30 being used by the operation, which is registered in the "execute_calc_instance_info_list" and being executed, has not occurred.

As a result of the confirmation, in a case where any of the Conditions (1) to (4) is not satisfied (see No route in Step F7), it is determined that an overlap has occurred, and the NG=true is set in Step F8 of FIG. 19. As a result of the confirmation in Step F7, in a case where at least one of the Conditions (1) to (4) is satisfied (see Yes route in Step F7), the process by the flowchart skips Step F8 and proceeds to Step F9 of FIG. 19. This is because when overlap has not occurred in any of the X-direction or Y-direction, an overlap between areas does not occur.

In Step F9, the loop limit process corresponding to Step F4 is performed. When the process for all elements of the "execute_calc_instance_info_list" is completed, the process by the flowchart proceeds to Step F10. In Step F10 of FIG. 19, it is confirmed whether the NG is set to true. In a case where the NG is not set to true, that is, in a case where the NG is set to false (No route in Step F10), the process proceeds to Step F11 of FIG. 19. In Step F11, the Y(boolY) is set to true, and also x=ax and y=ay are set. Thereafter, the process by the flowchart proceeds to Step B10 of FIG. 14.

That is, as a result of the confirmation in Step F7, in a case where the overlap between operational circuit resource groups to be verified and the operational circuit resource groups in which the operations are being executed has not occurred and an operational circuit resource group, to which the operational circuit is able to be set, is detected, the usable area finding process is ended as quickly as possible. As a result of the confirmation in Step F10, in a case where the NG is set to true (see Yes route in Step F10), the process proceeds to Step F12 of FIG. 19. In Step F12, the loop limit process corresponding to Step F2 is performed. When the process for all elements of "area_type=area_type_calc and 0≤ax<mx&&0ay<my" within the "area_info" is completed, the process by the flowchart proceeds to Step F13 of FIG. 19.

In Step F13, the Y(boolY) is set to false. Thereafter, the process by the flowchart proceeds to Step B10 of FIG. 14.

(A-5) Effect

As described above, the coupling circuit generation unit 114 performs control to cause the first shared area 31 and the second shared area 32 of the partial areas 30, which functioned as the operational circuit, to function as the coupling circuit after the operation processing using the operational circuit is ended in the operation processing device 1 as the example of the first embodiment. That is, a coupling circuit portion is revived in the operational circuit after the operation process is ended by the operational circuit.

With this, another operational circuit is able to access the external I/F 191 using the revived coupling circuit in the operational circuit on the FPGA 19 and input output (IO) performance by the operational circuit formed on the FPGA 19 may be improved. That is, processing performance is improved in the FPGA 19. In a case where the operational circuit area 33 of the operational circuit which is the same as the operational circuit pertaining to the operation request remains on the FPGA 19, the operational circuit generation unit 112 sets the configuration information configuring the operational circuit only to the wiring circuit portion in the operational circuit.

With this, the operational circuit is formed on the FPGA 19 and the operational circuit is restored in its entirety in a short period of time without performing writing of configuration information regarding the operational circuit area 33. That is, a time desired for forming the operational circuit is reduced and also processing performance in the FPGA 19 is improved accordingly.

(B) Second Embodiment

In the operation processing device 1 as the example of the first embodiment described above, the coupling circuit generation unit 114 revives the coupling circuit portion in the operational circuit after the operation processing using the operational circuit is ended.

On the contrary, in the operation processing device 1 of the second embodiment, the coupling circuit generation unit 114 does not revive the coupling circuit portion in the operational circuit immediately after the operation processing using the operational circuit is ended but revives only a wiring circuit portion existing on a path which couples the operational circuit and the external I/F 191 when other operational circuit is formed. As such, the operation processing device 1 of the second embodiment is mainly different from the operation processing device 1 of the first embodiment in that the coupling circuit generation unit 114 and timing at which the coupling circuit portion is revived, and other matters are configured to be similar to those of the operation processing device 1 of the first embodiment.

(B-1) Operation

Figure 20:
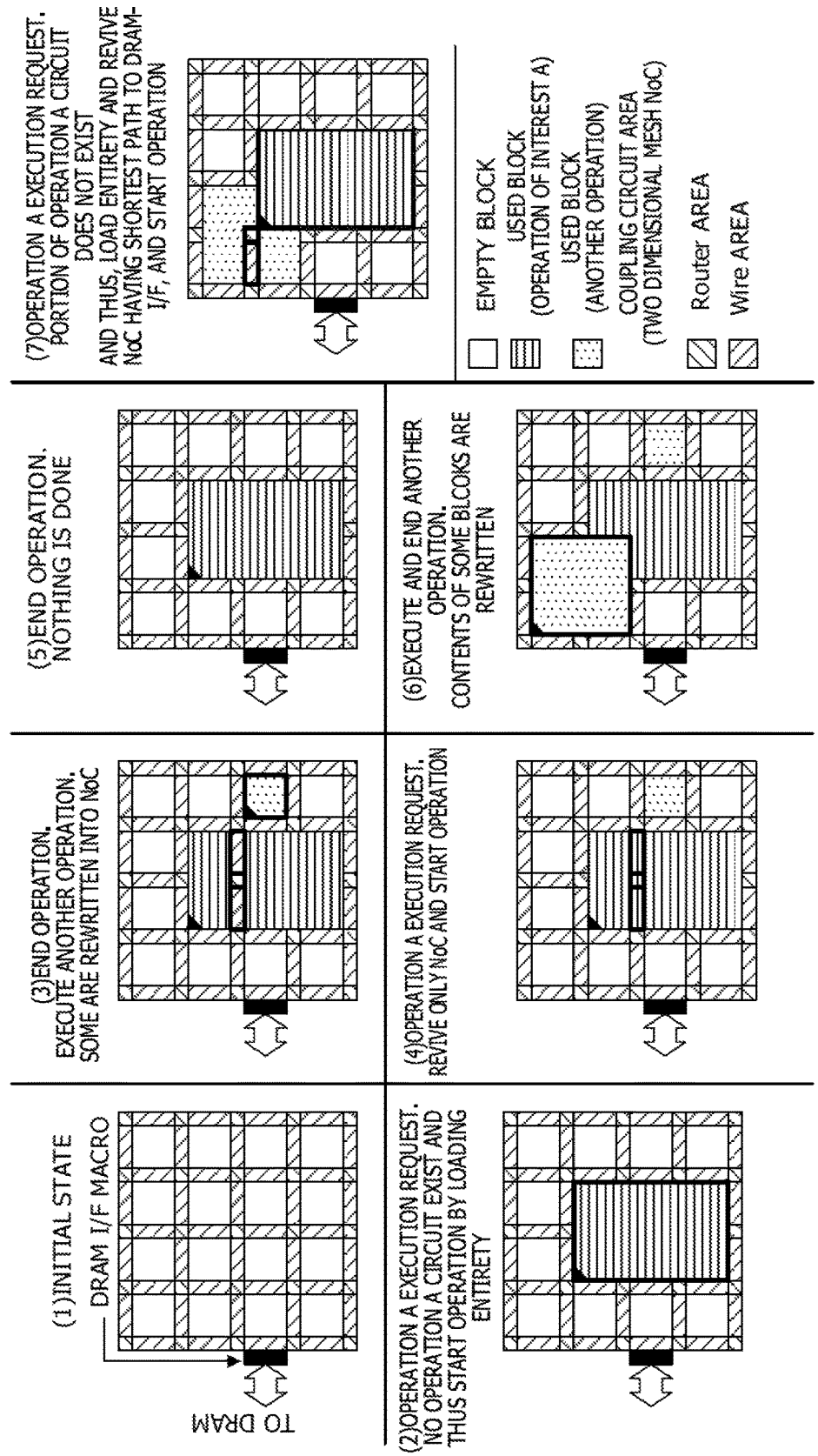
FIG. 20 is a diagram illustrating a method for forming an operational circuit onto an FPGA in an operation processing device as an example of a second embodiment.

A method for forming the operational circuit onto the FPGA 19 in the operation processing device 1 as an example of the second embodiment configured as described above will be described using FIG. 20. In an initial state, an operational circuit is not set in the FPGA 19 (see reference symbol (1)). The FPGA 19 is provided with the external I/F 191 and the operational circuit formed on the FPGA 19 communicates with the outside (for example, CPU 11) of the FPGA 19 through the external I/F 191.

When the operation recognition unit 110 recognizes an execution request for an operation A, the selection unit 111 confirms whether the operational circuit A capable of processing (executing) the operation A exists on the FPGA 19 in a state of being unused. In the present example, the operational circuit A does not exist on the FPGA 19 and thus the selection unit 111 selects an empty area in the FPGA 19 as an area in which the operational circuit is capable of being formed.

The operational circuit generation unit 112 forms the operational circuit A, which corresponds to the operation request, in the area selected by the selection unit 111 (see reference symbol (2)). The operational circuit A is configured using a plurality of adjacent partial areas 30 (first shared area 31, second shared area 32, and operational circuit area 33) in the FPGA 19. A case where an operational circuit C is formed at a position adjacent to the operational circuit A when the process is by the operational circuit A is ended on the FPGA 19 is considered.

In the operation processing device 1 of the second embodiment, a wire path which couples the operational circuit C and the external I/F 191 in a shortest distance path is formed. That is, the coupling circuit generation unit 114 sets a piece of configuration information (communication network configuration information) configuring the wiring circuit to the first shared area 31 and the second shared area 32 positioned on the wire path among the operational circuit resource groups configuring the operational circuit A to thereby revives the coupling circuit (NoC) (see reference symbol (3)).

With this, in the operational circuit C formed at a position adjacent to the operational circuit A, the router 32 positioned at the upper left of the operational circuit C and the external I/F 191 are coupled through the coupling circuit formed within the area of the operational circuit A. That is, the operational circuit C is coupled to the external I/F 191 by the shortest path. Accordingly, the operational circuit C accesses the external I/F 191 by the shortest path using the revived coupling circuit in the operational circuit and the IO performance by the operational circuit formed on the FPGA 19 is improved.

Thereafter, when the operation recognition unit 110 receives the execution request for the operation A again, the operational circuit generation unit 112 sets the piece of configuration information configuring the operational circuit to the area (wiring circuit portion) which was used as the coupling circuit in the operational circuit. With this, the operational circuit generation unit 112 reproduces the operational circuit A (see reference symbol (4)). In the second embodiment, the coupling circuit generation unit 114 does not perform reviving of the coupling circuit (NoC) in the operational circuit A (see reference symbol (5)) when the process by the operational circuit A is ended.

Thereafter, other operation request is performed and some of operational circuit areas 33 used for configuring the operational circuit A are rewritten by other operational circuit (see reference symbol (6)). In this state, when the operation recognition unit 110 receives the execution request for the operation A again, the operational circuit generation unit 112 sets the piece of configuration information configuring the operational circuit A to all areas 30 constituting the operational circuit A. With this, the operational circuit generation unit 112 reproduces the operational circuit A (see reference symbol (7)).

(B-2-1) Outline of Operation Processing

Next, an outline of the communication network restoration process by the coupling circuit generation unit 114 in the operation processing device 1 as the example of the second embodiment configured as described above will be described according to a flowchart (Steps G1 to G5) illustrated in FIG. 21. The following example, as illustrated in the reference symbol (1) of FIG. 21, indicates a case where an execution request for an operation D has occurred in a state where operational circuits B and C which execute operations B and C are being respectively arranged and in a state of being executed on the FPGA 19.

Figure 21:
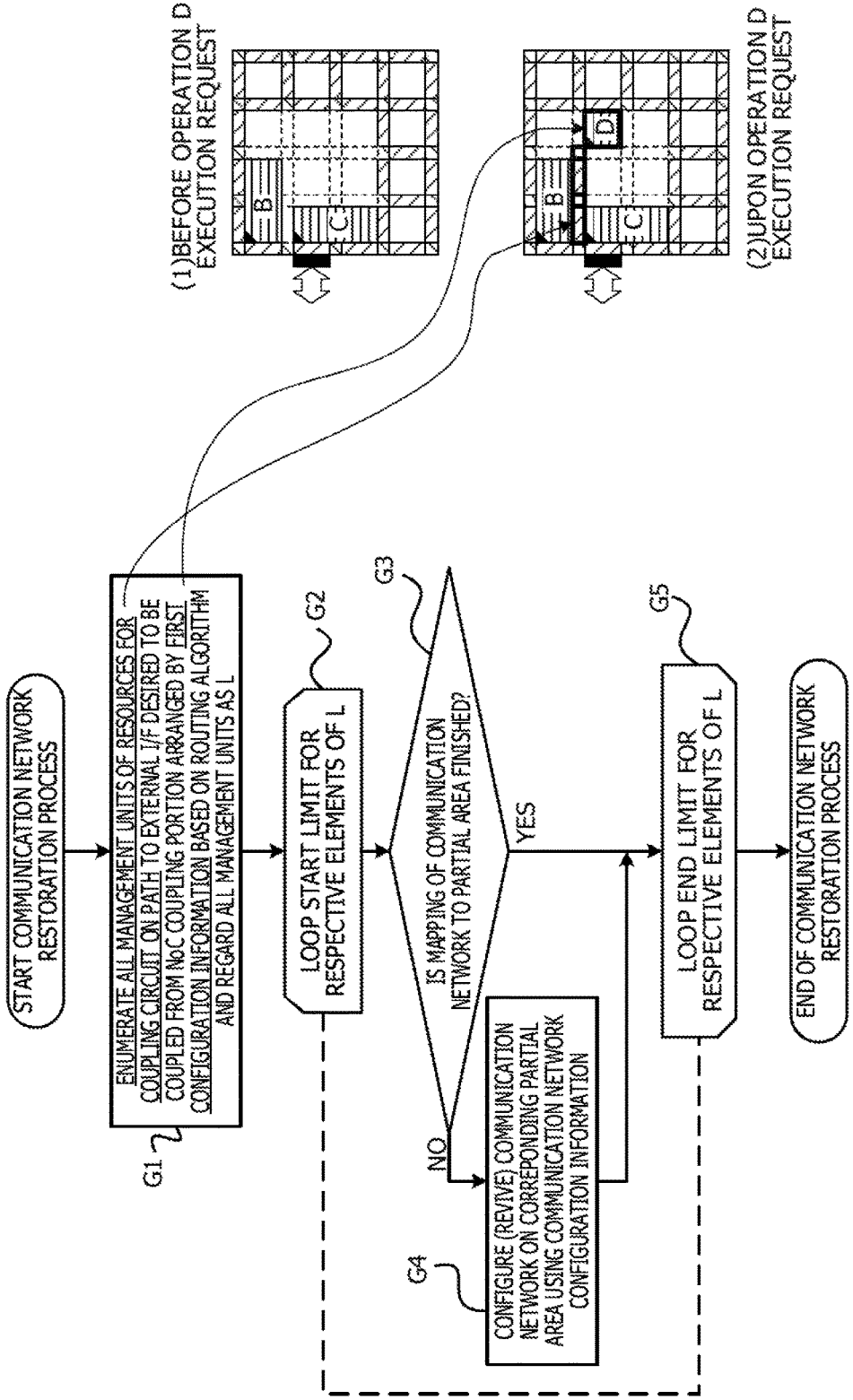
FIG. 21 is a flowchart illustrating an outline of communication network restoration process by a coupling circuit generation unit in the operation processing device as the example of the second embodiment.

The operational circuit D which executes the operation D, as illustrated in the reference symbol (2) of FIG. 21, may be formed at a position, where the operational circuits B and C are spaced apart, on the FPGA 19. In Step G1, the coupling circuit generation unit 114 enumerates all paths connecting the router 32 used by the operational circuit D and the external I/F 191 on the FPGA 19 based on a routing algorithm. The coupling circuit generation unit 114 enumerates all partial areas 30 (management unit and element) regarding the wire 31 and the router 32 which constitute those all paths and regards the all partial areas as a set L.

The router 32 used by the operational circuit is specified by the piece of operational circuit configuration information (first partial configuration information) which is set to the operational circuit area 33 of the operational circuit. For example, an XY routing (dimension order routing) may be used as the routing algorithm. The routing algorithm is not limited thereto, and may use other schemes such as fixed routing or random routing, adaptive routing, dependable routing, and may be variously modified and performed.

In Step G2, a loop process, in which control from Step G2 to Step G4 is repeatedly performed for all the partial areas 30 which exist in the set L, is started. In Step G3, it is confirmed whether mapping of a communication network to the partial area 30 is finished. As a result of the confirmation, in a case where the mapping of the communication network to the partial area 30 is not finished (see No route in Step G3), the process by the flowchart proceeds to Step G4.

In Step G4, a communication network is formed (restored) in the partial area 30 using a piece of communication network configuration information. Thereafter, the process by the flowchart proceeds to Step G5. In Step G5, the loop limit process corresponding to Step G2 is performed. When the processes regarding all partial areas 30 existing in the set L are completed, the flow of the flowchart is ended.

As a result of the confirmation in Step G3, in a case where the mapping of the communication network to the partial area 30 is finished (see Yes route in Step G3), the process by the flowchart proceeds to Step G5.

(B-2-2) Details of a Process for Operation Request

Figure 22:
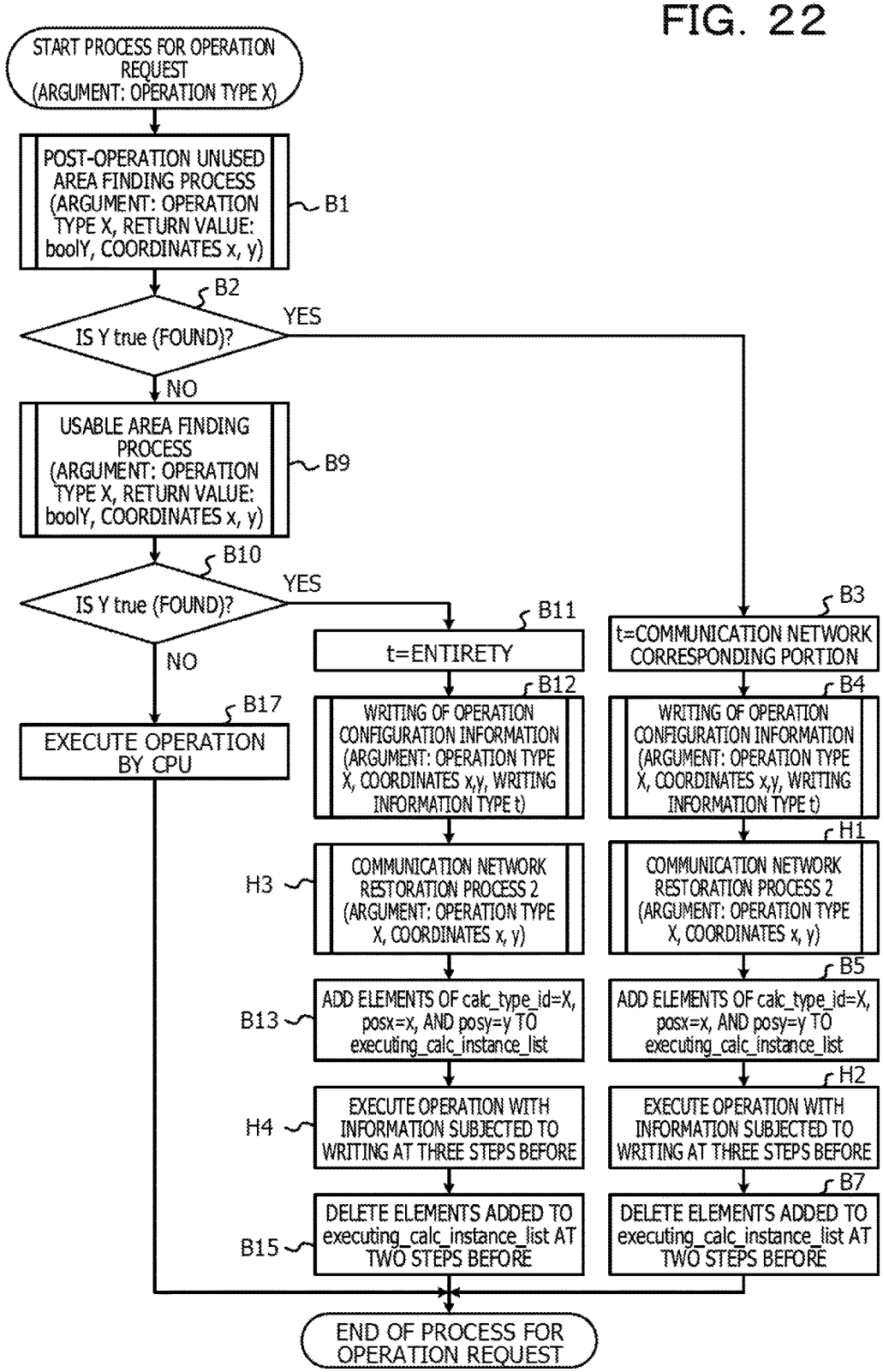
FIGS. 22 and 23 are flowcharts illustrating details of a process for an operation request in the operation processing device as the example of the second embodiment.
Figure 23:
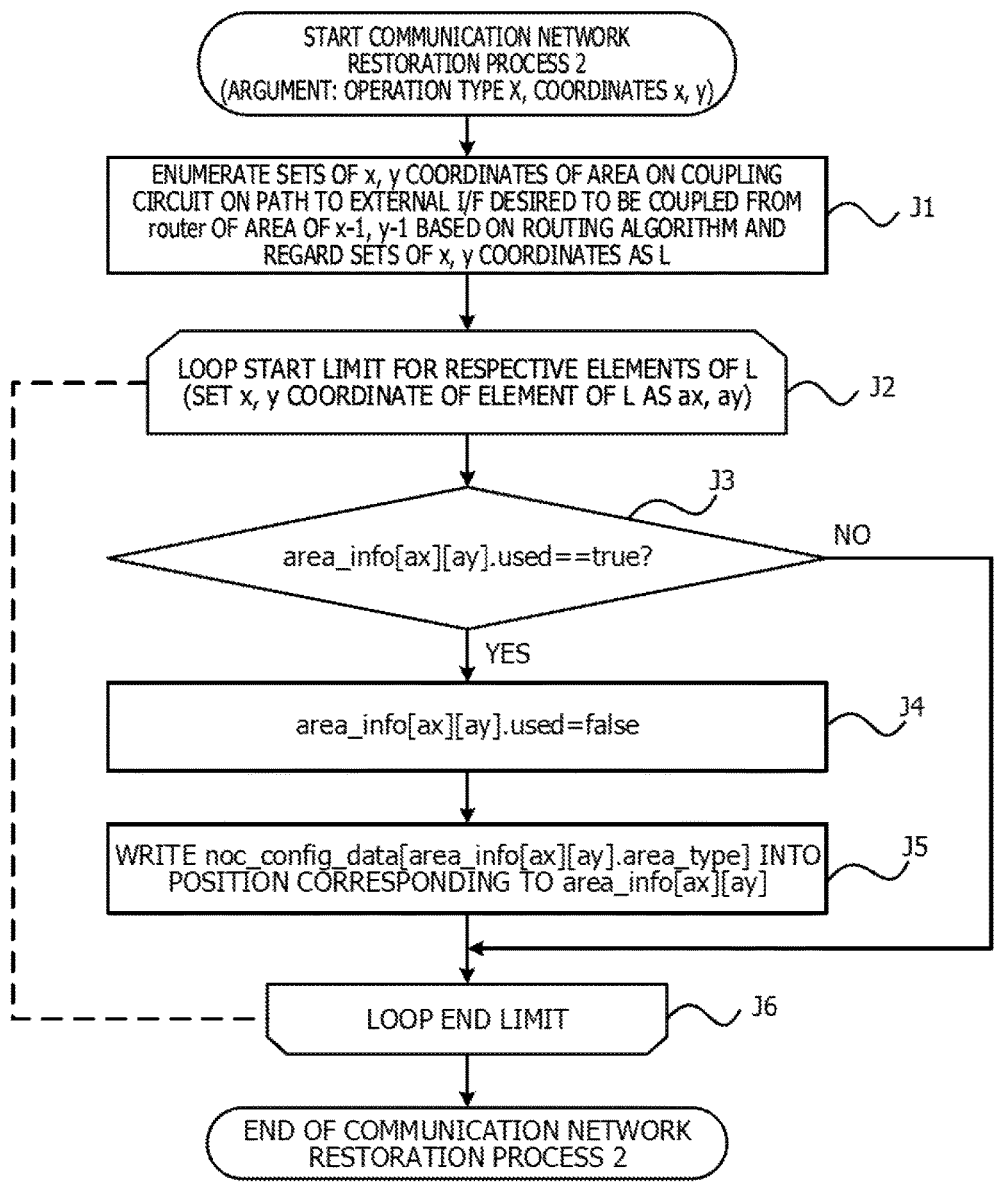

Next, details of the process for an operation request in the operation processing device 1 as the example of the second embodiment configured as described above will be described according to flowcharts illustrated in FIGS. 22 and 23 with reference to FIGS. 15 to 17 and 19. FIGS. 22 and 23 are flowcharts illustrating details of a process for an operation request in the operation processing device as the example of the second embodiment.

FIG. 22 is a flowchart (Steps B1 to B4, B5, B7, B9 to B13, B15, B17, and H1 to H4) illustrating the flow of the process for the operation request in its entirety and an operation type X pertaining to the operation request is used as an argument. FIG. 23 is a flowchart (Steps J1 to J5) indicating details of the communication network restoration process in the operation processing device 1 as the example of the second embodiment.

In FIG. 22, the steps denoted by the same reference numerals as those of the flowchart illustrated in FIG. 14 indicate the similar processes and thus detailed description thereof is omitted. After an operation configuration information writing process is performed in Step B4 of FIG. 22, the communication network restoration process is performed in Step H1. Details of the communication network restoration process will be described using FIG. 23 later. When the communication network restoration process is executed, the operation type X and the coordinates x and y are used as the argument. Thereafter, the process by the flowchart proceeds to Step B5 of FIG. 22.

In Step B5, elements of "calc_type_id=X", "posx=x", and "posy=y" are added to the "executing_calc_instance_info_list" as the piece of information of the operation which is being executed. In Step H2 of FIG. 22, the operation is executed with a piece of information subjected to writing at three steps before Step H2, that is, Step B4. In Step B7 of FIG. 22, elements of "calc_type_id=X", "posx=x", and "posy=y" are added to the "executing_calc_instance_info_list", which are added at two steps before, that is, in Step B5, are deleted. Thereafter, the process by the flowchart is ended.

After the operation configuration information writing process is performed in Step B12 of FIG. 22, the communication network restoration process is performed in Step H3. Details of the communication network restoration process will be described using FIG. 23 later. When the communication network restoration process is executed, the operation type X and the coordinates x and y are used as the arguments. Thereafter, the process by the flowchart proceeds to Step B13 of FIG. 22.

In Step B13, elements of "calc_type_id=X", "posx=x", and "posy=y" are added to the "executing_calc_instance_info_list" as the piece of information of the operation which is being executed. In Step H4 of FIG. 22, the operation is executed with a piece of information subjected to writing at three steps before Step H4, that is, Step B12. In Step B15 of FIG. 22, elements of "calc_type_id=X", "posx=x", and "posy=y" are added to the "executing_calc_instance_info_ list", which are added at two steps before, that is, in Step B13, are deleted. Thereafter, the process by the flowchart is ended.

(B-2-3) Communication Network Restoration Process

Next, communication network restoration process operation in the operation processing device 1 as the example of the second embodiment configured as described above will be described according to a flowchart (Steps J1 to J6) illustrated in FIG. 23. The following processing is mainly performed by the coupling circuit generation unit 114. In Step J1 of FIG. 23, sets of the X-coordinate and Y-coordinate of the partial areas 30, which are included in the wiring circuit configuring a path from the router 32 of an area of x−1 and y−1 to the external I/F 191, which is desired to be coupled, are enumerated based on the routing algorithm, and are regarded as the set L.

In Step J2 of FIG. 23, a loop process, in which control from Step J2 to Step J5 for all partial areas 30 (elements) included in the set L is repeatedly performed, is started. The X-coordinate and Y-coordinate of each element of the set L is regarded as the "ax" and the "ay", respectively.

In Step J3 of FIG. 23, it is confirmed whether the area_info[ax][ay].used=true. As a result of the confirmation, in a case where it is not the area_info[ax][ay]. used=true (see No route in Step J3), the process by the flowchart proceeds to Step J6 of FIG. 23.

On the other hand, as a result of the confirmation, in a case where it is the area_info[ax][ay].used=true (see Yes route in Step J3), the process by the flowchart proceeds to Step J4 of FIG. 23. In Step J4, the area_info[ax][ay].used is set to false. Thereafter, the noc_config_data[area_info[ax][ay]. area_type] is written into the position corresponding to the area_info[ax][ay] in Step J5 of FIG. 23.

In Step J6 of FIG. 23, the loop limit process corresponding to Step J2 is performed. When the process for all partial areas 30 included in the set L is completed, the process by the flowchart proceeds to Step B5 or Step B13 in the flowchart illustrated in FIG. 22.

(B-3) Effect

As described above, in the operation processing device 1 as the example of the second embodiment, when another operational circuit is formed after the operation process using the operational circuit is ended, the coupling circuit generation unit 114 revives the wiring circuit portion which exists on the path coupling the operational circuit and the external I/F 191.

With this, other operational circuit is able to access the external I/F 191 using the revived coupling circuit in the operational circuit on the FPGA 19 and input output (IO) performance by the operational circuit formed on the FPGA 19 may be improved. That is, processing performance is improved in the FPGA 19. In this case, the coupling circuit generation unit 114 revives only the wiring circuit portion which exists on the path coupling the operational circuit newly formed and the external I/F 191 to thereby reduce load and achieve speeding up of a process.

The coupling circuit generation unit 114 does not perform reviving of the coupling circuit portion at the time when the operation processing using the operational circuit is ended and accordingly, the load is also reduced and speeding up of the process is achieved.

(C) Others

The technique disclosed is not limited to the embodiments described above and may be embodied by being variously modified without departing form a gist of the present disclosure. Respective configuration and processes may be either selected as occasion demands or appropriately combined.

Figure 24:
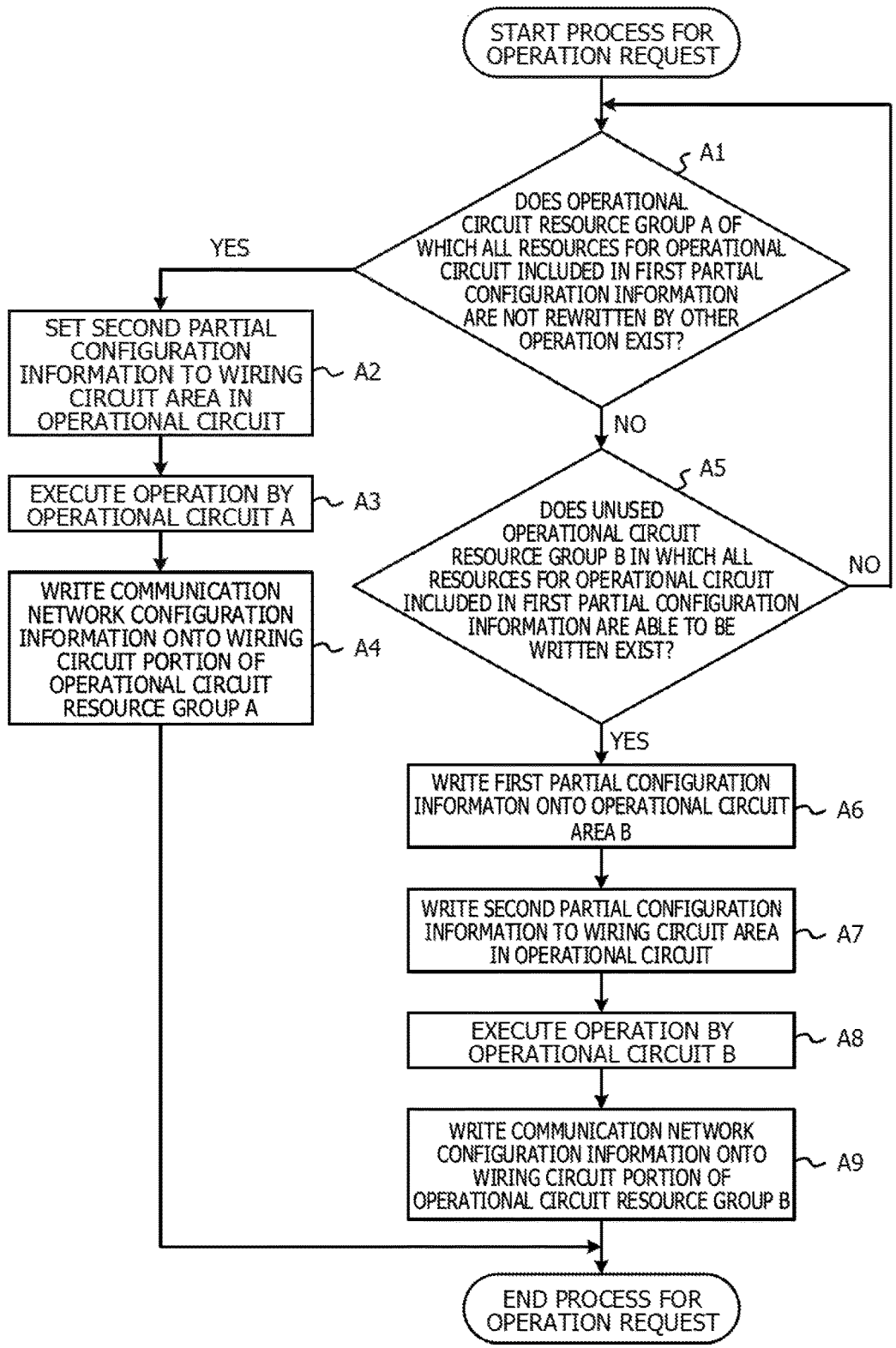
FIG. 24 is a flowchart illustrating an outline of a process for an operation request in an operation processing device as a modification example of the first embodiment.

For example, in each embodiment described above, although the operation request is executed by the CPU 11 in a case where the operational circuit is not able to be formed in the FPGA 19, but the embodiment is not limited thereto. For example, the embodiment may be embodied by being variously modified, for example, in such a way that an execution of the operation request is allowed to be waited until the operational circuit is able to be formed in the FPGA 19. FIG. 24 is a flowchart (Steps A1 to A9) illustrating an outline of a process for an operation request in an operation processing device 1 as a modification example of the first embodiment.

In FIG. 24, the steps denoted by the same reference numerals as those of the flowchart illustrated in FIG. 13 indicate the similar processes and thus detailed description thereof is omitted. In the modification example, as a result of the confirmation in Step A5, in a case where the operational circuit resource group B of the operational circuit does not exist on the FPGA 19 (see No route in Step A5), the process by the flowchart returns to Step A1. With this, until an operational circuit resource group capable of allocating the operational circuit to the FPGA 19 is generated, the process is repeatedly executed to meet the situation where the operational circuit is formed.

The present modification example may be applied to the operation processing device 1 of the second embodiment. The embodiment described above may be embodied or manufactured by an ordinary skilled person in the related art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An operation processing device comprising:
    a memory; and
    a processor coupled to the memory and configured to control a programmable integrated circuit capable of arbitrarily changing an internal circuit configuration and including, as an operational circuit resource, a plurality of first areas each of which has the same shape and a plurality of second areas formed between the plurality of first areas and further configured to:
        recognize a first request of a first operation which is executed by the programmable integrated circuit,
        check whether a not-written operational circuit resource which is not rewritten by another operational circuit after initially being written to for generating a first operational circuit exists in the operational circuit resource;
        select, when the not-written operational circuit resource exists, a third area corresponding to the second areas and a fourth area corresponding to the first areas which are used for the first operation from the not-written operational circuit resource,
        set second configuration information to the selected third area to generate the first operational circuit, cause the generated first operational circuit to execute the first operation, after the first operation is completed, cause the third area included in the first operational circuit to function as a communication path which is used by a second operational circuit other than the first operational circuit to transmit and receive data to and from another operational circuit or an external interface, check, when the not-written operational circuit resource does not exist, whether a not-used operational circuit resource which is not used by another operational circuit exists in the operational circuit resource, select, when the not-used operational circuit resource exists, the third area corresponding to the second areas and the fourth area corresponding to the first areas which are used for the first operation from the not-used operational circuit resource, set the second configuration information and first configuration information to the selected third area and the selected fourth area, respectively, to generate the first operational circuit, cause the generated first operational circuit to execute the first operation, after the first operation is completed, cause the third area included in the first operational circuit to function as a communication path which is used by the second operational circuit to transmit and receive data to and from the another operational circuit or the external interface, and cause, when the not-used operational circuit resource does not exist, a central processing unit (CPU) to execute the first operation.

2. The operation processing device according to claim 1, wherein the processor is configured to: when another operation request which is the same as the first request is received, cause to revive the first operational circuit by causing the third area which functions as the communication path to function as the first operational circuit.

3. The operation processing device according to claim 1, wherein the processor is configured to:

reference first management information indicating a use state of the plurality of first areas and the plurality of second areas in the programmable integrated circuit and second management information indicating a process which is being executed in the programmable integrated circuit, and when the first operational circuit includes the fourth area which is in a state of being unused, cause the third area included in the first operational circuit to function as the communication path in the programmable integrated circuit.

4. The operation processing device according to claim 1, wherein the processor is configured to: when a second operational circuit pertaining to a second request of a second operation different from the first operation is generated after the first operation is completed, cause the third area included in the first operational circuit to function as the communication path.

5. The operation processing device according to claim 1, wherein the programmable integrated circuit is a field programmable gate array.

6. A system comprising:

a programmable integrated circuit capable of arbitrarily changing an internal circuit configuration and including, as an operational circuit resource, a plurality of first areas each of which has the same shape and a plurality of second areas formed between the plurality of first areas; and a processor configured to:

recognize a first request of a first operation which is executed by the programmable integrated circuit, check whether a not-written operational circuit resource which is not rewritten by another operational circuit after initially being written to for generating a first operational circuit exists in the operational circuit resource;

select, when the not-written operational circuit resource exists, a third area corresponding to the second areas and a fourth area corresponding to the first areas which are used for the first operation from the not-written operational circuit resource, set second configuration information to the selected third area to generate the first operational circuit, cause the generated first operational circuit to execute the first operation, after the first operation is completed, cause the third area included in the first operational circuit to function as a communication path which is used by a second operational circuit other than the first operational circuit to transmit and receive data to and from another operational circuit or an external interface, check, when the not-written operational circuit resource does not exist, whether a not-used operational circuit resource which is not used by another operational circuit exists in the operational circuit resource, select, when the not-used operational circuit resource exists, the third area corresponding to the second areas and the fourth area corresponding to the first areas which are used for the first operation from the not-used operational circuit resource, set the second configuration information and first configuration information to the selected third area and the selected fourth area, respectively, to generate the first operational circuit, cause the generated first operational circuit to execute the first operation, after the first operation is completed, cause the third area included in the first operational circuit to function as a communication path which is used by the second operational circuit to transmit and receive data to and from the another operational circuit or the external interface, and cause, when the not-used operational circuit resource does not exist, a central processing unit (CPU) to execute the first operation.

7. The system according to claim 6, wherein the processor is configured to: when another operation request which is the same as the first operation request is received, causing to revive the first operational circuit by causing the third area which functions as the communication path to function as the first operational circuit.

8. The system according to claim 6, wherein the processor is configured to:

reference first management information indicating a use state of the plurality of first areas and the plurality of second areas in the programmable integrated circuit and second management information indicating a process which is being executed in the programmable integrated circuit, and when the first operational circuit includes the fourth area which is in a state of being unused, cause the third area included in the first operational circuit to function as the communication path in the programmable integrated circuit.

9. The system according to claim 6, wherein the processor is configured to: when a second operational circuit pertaining to a second request of a second operation different from the first operation is generated after the first operation is completed, cause the third area included in the first operational circuit to function as the communication path.

10. The system according to claim 6, wherein the programmable integrated circuit is a field programmable gate array.

11. A method comprising:
recognizing, by a processor, a first request of a first operation which is executed by a programmable integrated circuit capable of arbitrarily changing an internal circuit configuration and including, as an operational circuit resource, a plurality of first areas each of which has the same shape and a plurality of second areas formed between the plurality of first areas;
checking whether a not-written operational circuit resource which is not rewritten by another operational circuit after initially being written to for generating a first operational circuit exists in the operational circuit resource;
selecting, when the not-written operational circuit resource exists, a third area corresponding to the second areas and a fourth area corresponding to the first areas which are used for the first operation from the not-written operational circuit resource;
setting second configuration information to the selected third area to generate the first operational circuit;
causing the generated first operational circuit to execute the first operation;
after the first operation is completed, causing the third area included in the first operational circuit to function as a communication path which is used by a second operational circuit other than the first operational circuit to transmit and receive data to and from another operational circuit or an external interface,
checking, when the not-written operational circuit resource does not exist, whether a not-used operational circuit resource which is not used by another operational circuit exists in the operational circuit resource,
selecting, when the not-used operational circuit resource exists, the third area corresponding to the second areas and the fourth area corresponding to the first areas which are used for the first operation from the not-used operational circuit resource,
setting the second configuration information and first configuration information to the selected third area and the selected fourth area, respectively, to generate the first operational circuit,
causing the generated first operational circuit to execute the first operation,
after the first operation is completed, cause the third area included in the first operational circuit to function as a communication path which is used by the second operational circuit to transmit and receive data to and from the another operational circuit or the external interface, and
causing, when the not-used operational circuit resource does not exist, a central processing unit (CPU) to execute the first operation.

12. The method according to claim 11, further comprising: when another operation request which is the same as the first request is received, causing to revive the first operational circuit by causing the third area which functions as the communication path to function as the first operational circuit.

13. The method according to claim 11, further comprising:
referencing first management information indicating a use state of the plurality of first areas and the plurality of second areas in the programmable integrated circuit and second management information indicating a process which is being executed in the programmable integrated circuit; and
when the first operational circuit includes the fourth area which is in a state of being unused, causing the third area included in the first operational circuit to function as the communication path in the programmable integrated circuit.

14. The method according to claim 11, further comprising:
when a second operational circuit pertaining to a second request of a second operation different from the first operation is generated after the first operation is completed, causing the third area included in the first operational circuit to function as the communication path.

15. The method according to claim 11, wherein the programmable integrated circuit is a field programmable gate array.

* * * * *